(12) United States Patent
Nagata et al.

(10) Patent No.: US 9,312,723 B2
(45) Date of Patent: Apr. 12, 2016

(54) SECONDARY-BATTERY MONITORING DEVICE AND BATTERY PACK

(71) Applicant: Mitsumi Electric Co., Ltd., Tokyo (JP)

(72) Inventors: Shogo Nagata, Tokyo (JP); Yasuaki So, Kodaira (JP); Takeshi Yamaguchi, Fuchu (JP); Norihito Kawaguchi, Akishima (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 420 days.

(21) Appl. No.: 13/757,757

(22) Filed: Feb. 2, 2013

(65) Prior Publication Data

US 2013/0229144 A1    Sep. 5, 2013

(30) Foreign Application Priority Data

Mar. 2, 2012    (JP) .................................. 2012-46043

(51) Int. Cl.
*H02J 7/00* (2006.01)
*G01R 19/165* (2006.01)
*H01M 10/42* (2006.01)

(52) U.S. Cl.
CPC ......... *H02J 7/0072* (2013.01); *G01R 19/16542* (2013.01); *H01M 10/4257* (2013.01); *H02J 7/0004* (2013.01); *H02J 7/0011* (2013.01); *H02J 2007/0039* (2013.01); *Y02E 60/12* (2013.01)

(58) Field of Classification Search
CPC ............ H02J 7/0072; H02J 2007/0019; H02J 7/0004; H02J 2007/0039; Y02E 60/12
USPC .................. 320/107, 118, 132, 134, 135, 136
See application file for complete search history.

(56) References Cited

U.S. PATENT DOCUMENTS

| | | | | |
|---|---|---|---|---|
| 4,255,789 A | * | 3/1981 | Hartford et al. | ............... 701/108 |
| 4,275,344 A | * | 6/1981 | Mori et al. | ........................ 322/28 |
| 4,609,861 A | * | 9/1986 | Inaniwa et al. | ............... 320/152 |
| 4,979,094 A | * | 12/1990 | Gemmell et al. | ............... 700/83 |
| 5,955,869 A | * | 9/1999 | Rathmann | ..................... 320/132 |
| 6,025,695 A | * | 2/2000 | Friel et al. | ..................... 320/106 |

(Continued)

FOREIGN PATENT DOCUMENTS

| | | |
|---|---|---|
| JP | 11-127543 A | 5/1999 |
| JP | 2001-014042 A | 1/2001 |

(Continued)

OTHER PUBLICATIONS

Office Action dated Feb. 20, 2014, in Korean Patent Application No. 10-2013-12359.

*Primary Examiner* — Helen Rossoshek
(74) *Attorney, Agent, or Firm* — Miles & Stockbridge P.C.

(57) ABSTRACT

A secondary-battery monitoring device capable of realizing highly reliable overcurrent detection and a battery pack having it are provided. When an overcurrent flowing to a secondary battery is to be detected by utilizing a current detection voltage generated via on-resistance of a discharge-control switch and a charge-control switch, a voltage correction circuit that generates a correction voltage having a characteristic varied by positive slope or negative slope along with increase in a power supply voltage is provided, and the correction voltage is added to the detection voltage or a reference power supply voltage with the polarity that cancels out the slope of voltage variation caused in the detection voltage, and then the voltage is input to a comparator circuit. In this manner, variation in the overcurrent determination current is reduced.

10 Claims, 18 Drawing Sheets

(56) References Cited

U.S. PATENT DOCUMENTS

| | | | | |
|---|---|---|---|---|
| 6,157,165 A | * | 12/2000 | Kinoshita et al. | 320/116 |
| 7,652,458 B2 | * | 1/2010 | Park | H02J 7/0072 323/282 |
| 7,728,553 B2 | * | 6/2010 | Carrier | H01M 2/1022 320/116 |
| 8,093,863 B2 | * | 1/2012 | Carrier | H01M 2/1022 320/116 |
| 8,203,314 B2 | * | 6/2012 | Odaohhara | 320/150 |
| 8,723,527 B2 | * | 5/2014 | Kudo et al. | 324/433 |
| 2007/0080905 A1 | * | 4/2007 | Takahara | 345/76 |
| 2009/0085527 A1 | * | 4/2009 | Odaohhara | 320/150 |
| 2011/0299206 A1 | | 12/2011 | Tsukamoto et al. | |
| 2012/0235636 A1 | * | 9/2012 | Partovi | 320/108 |
| 2014/0152261 A1 | * | 6/2014 | Yamauchi et al. | 320/118 |

FOREIGN PATENT DOCUMENTS

| | | |
|---|---|---|
| JP | 2002-374630 A | 12/2002 |
| JP | 2009-131020 A | 6/2009 |
| JP | 2011-254667 A | 12/2011 |
| JP | 2012-042419 A | 3/2012 |

* cited by examiner

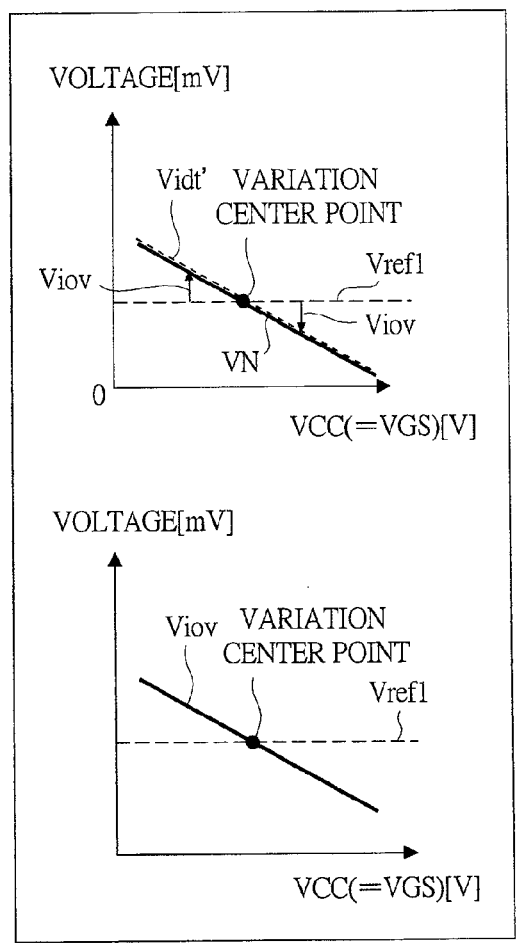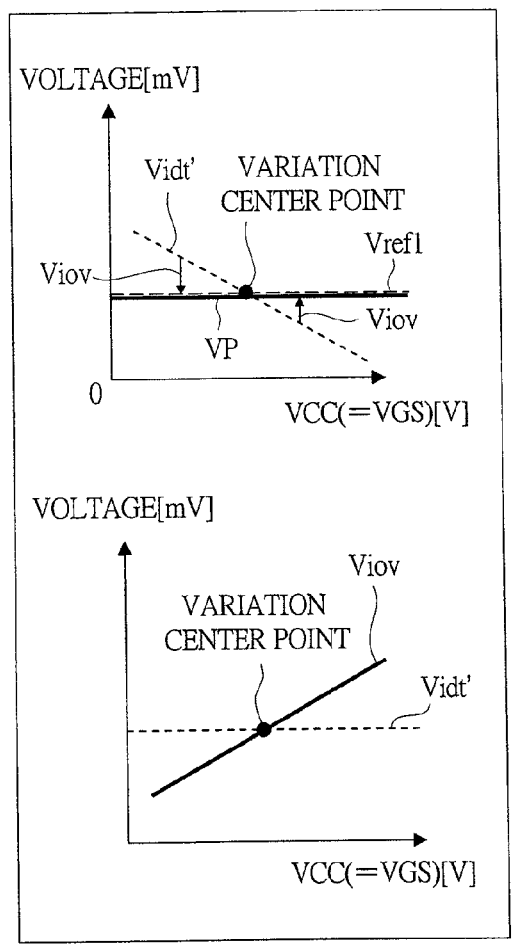
FIG. 4A
FIG. 4B

SECONDARY-BATTERY MONITORING DEVICE AND BATTERY PACK

CROSS-REFERENCE TO RELATED APPLICATION

The present application claims priority from Japanese Patent Application No. 2012-046043 filed on Mar. 2, 2012, the content of which is hereby incorporated by reference into this application.

TECHNICAL FIELD OF THE INVENTION

The present invention relates to a secondary-battery monitoring device and a battery pack, and relates to techniques effectively applied to, for example, a secondary-battery monitoring device for monitoring a lithium-ion secondary battery and to a battery pack including the secondary-battery monitoring device and the lithium-ion secondary battery.

BACKGROUND OF THE INVENTION

For example, Japanese Patent Application Laid-Open Publication No. 2002-374630 (Patent Document 1), Japanese Patent Application Laid-Open Publication No. 2009-131020 (Patent Document 2), Japanese Patent Application Laid-Open Publication No. 2001-14042 (Patent Document 3) and Japanese Patent Application Laid-Open Publication No. H11-127543 (Patent Document 4) show systems in which an overcurrent at a secondary battery is detected via on-resistance of a FET inserted in a current path thereof to protect against the overcurrent. Specifically, Patent Document 1 shows techniques for maintaining gate voltages of a charge-control switch element and a discharge-control switch element to be constant regardless of a battery voltage, thereby keeping the on-resistance of each switch element constant. The gate voltage is set to be, for example, the possible lowest voltage of the battery voltage. Patent Document 2 shows techniques in which first and second reference FETs having the same characteristics as charge and discharge FETs are provided, the same gate voltage is applied to the first and second reference FETs, and a voltage detected via the on-resistance of the charge and discharge FETs is determined with using a voltage generated via the first and second reference FETs as a reference voltage.

Furthermore, Patent Document 3 shows techniques in which a detection voltage detected via the on-resistance of a FET is compared with a reference voltage generated in a reference-voltage control circuit (voltage reduced in a curve along with increase in a battery voltage), and when the detection voltage exceeds the reference voltage, the FET is driven to be off. Patent Document 4 shows techniques in which a gate voltage of a discharge-control FET is added as an offset voltage to a detection voltage detected via the on-resistance of the FET, and a discharge-current detection voltage obtained by this addition is used to detect an overcurrent. In this manner, when a discharge-control FET having low on-resistance is used, the overcurrent can be detected without applying a current more than necessary to the FET.

SUMMARY OF THE INVENTION

For example, in a portable electronic device typified by a mobile phone, a lithium-ion secondary battery is used in most cases for the reasons of light weight, high capacity, long cycle life, and others. However, due to the high capacity, the lithium-ion secondary battery has high risks of swelling, heat generation, and ignition in a state of, for example, overcharging and short-circuit between external connection terminals. Therefore, in order to avoid the risky states, a secondary-battery monitoring device is attached to the lithium-ion secondary battery. The secondary-battery monitoring device detects, for example, overvoltage (overcharge voltage, overdischarge voltage) and overcurrent (overdischarge current, overcharge current) at the secondary battery, and controls on/off of a discharge-control switch and a charge-control switch in accordance with these detection results.

FIG. 17A is a schematic drawing showing a configuration example of a main part of a conventional battery pack studied in the course of accomplishing the present invention, and FIG. 17B is a circuit diagram showing a configuration example of a driver circuit of FIG. 17A. The battery pack shown in FIG. 17A is provided with a secondary battery BAT and a secondary-battery monitoring device BATCTL', which controls charge/discharge currents of BAT. BATCTL' is provided with a discharge-control switch FETd, a charge-control switch FETc, and a switch control unit SWCTL', which controls on/off of these switches in accordance with the state of BAT. Between a positive terminal PP and a negative terminal PN of BATCTL', a charger CGR which charges BAT or a load circuit LD which is driven by BAT is coupled.

The discharge-control switch FETd and the charge-control switch FETc are made up of, for example, field-effect transistors, and sources and drains thereof are coupled in series on a current path of the secondary battery BAT. The switch control unit SWCTL' is provided with an overcurrent determination block IJGEBK' which has an overcurrent protection function, driver circuits DRVd and DRVc which drive gates of FETd and FETc, and a control logic circuit LOG which generates input signals of DRVd and DRVc in accordance with determination results of IJGEBK'.

In normal operation, the switch control unit SWCTL' controls both of FETd and FETc to be on to set the state in which both of charge and discharge can be carried out. At this time, SWCTL' detects a current Ibat flowing to the secondary battery BAT and converts it to a current detection voltage by utilizing the on-resistance of the FETd and FETc connected in series, and monitors the magnitude of the current detection voltage Vidt by using the overcurrent determination block IJGEBK'. For example, since a positive voltage is detected as Vidt at an IDT terminal at the time of discharge, when the positive voltage generated as Vidt exceeds a predetermined overcurrent determination voltage Vref1, a comparator circuit CMPd in IJGEBK' outputs a detection signal to the control logic circuit LOG. Therefore, when the discharge current (Ibat) of BAT becomes excessive, this is detected via CMPd, and FETd is controlled to be off via LOG and the driver circuit DRVd. As a result, a discharge path of BAT is shut off, and only a charge path through a body diode D1 of FETd and FETc in an on-state is formed.

On the other hand, since a negative voltage is detected as Vidt at the IDT terminal at the time of charge, when a positive voltage generated by converting the polarity of the negative voltage generated as the detection voltage Vidt by an inverting amplifier circuit AMPR exceeds a predetermined overcurrent determination voltage Vref2, a comparator circuit CMPc in the overcurrent determination block IJGEBK' outputs a detection signal to the control logic circuit LOG. Therefore, when the charge current (Ibat) of the secondary battery BAT becomes excessive, this is detected via CMPc, and FETc is controlled to be off via LOG and the driver circuit DRVc. As a result, the charge path of BAT is shut off, and only a discharge path through a body diode D2 of FETc and FETd in an on-state is formed. In this manner, overcurrent protection to BAT is carried out. As shown in FIG. 17B, each of the driver circuits DRVc and DRVd is made up of, for example, a CMOS inverter circuit using the output of BAT as a power supply voltage VCC.

However, in such a configuration example, the output voltages of the driver circuits DRVc and DRVd are varied depending on the output voltage of the secondary battery (power supply voltage VCC), and as a result, the on-resistance of the discharge-control switch FETd and the charge-control switch FETc is varied. Therefore, there is a possibility that highly reliable detection of overcurrent becomes difficult. FIG. 18A and FIG. 18B are explanatory drawings showing an example of a problem in the configuration example of FIG. 17. As shown in FIG. 18A, the on-resistance (Ron) of FETd and FETc is reduced in a curve as a gate/source voltage VGS (described as VCC (=VGS) in FIG. 18A since the power supply voltage VCC is supplied as VSG via the driver circuit DRV, and the same is true of other drawings) increases. On the other hand, the comparator circuit CMPd in the overcurrent determination block IJGEBK' determines the current detection voltage Vidt (=Ibat×Ron) based on the overcurrent determination voltage Vref1 which is constant without depending on the power supply voltage VCC, and when Vidt (=Ibat× Ron)≥Vref1, it determines that the discharge overcurrent is detected. Similarly, when Vidt (=Ibat×Ron)≥Vref2, the comparator circuit CMPc determines that the charge overcurrent is detected.

As a result, the value of the current Ibat determined as an overcurrent in actual operation (in other words, threshold value (permissible value) of Ibat in actual operation, and this is referred to as an overcurrent determination current Iov in the present specification) has dependency on the power supply voltage VCC as shown in FIG. 18A and FIG. 18B. Specifically, according to the relation "Iov×Ron=Vref1 (constant)", when the on-resistance (Ron) is reduced along with increase in VCC, Iov is increased by the amount that cancels it out. Accordingly, for example when Iov is varied to be large, there is a possibility that the secondary battery BAT is damaged. More strictly, since Ron has temperature dependency, as shown in FIG. 18B, Iov also has temperature dependency in a strict sense. However, in practice, variation caused due to VCC is much larger than the variation caused due to the temperature dependency.

In order to reduce such variations in the overcurrent determination current Iov, the use of the techniques as shown in Patent Documents 1 to 3 has been considered. The techniques of Patent Document 1 are a system in which the dependency of the on-resistance (Ron) itself on the power supply voltage VCC is reduced, and the techniques of Patent Document 2 and Patent Document 3 are systems in which the VCC dependency similar to that of the current detection voltage Vidt is given to the overcurrent determination voltage (Vref). However, when a constant gate/source voltage VGS is to be generated by stepping-down the varying VCC by using the techniques of Patent Document 1, the VCC dependency can be resolved in a wide range by setting VGS to be low (for example, lower limit value of VCC), but on the other hand, there is a possibility that power loss occurs due to the overall increase in the on-resistance (Ron). Instead, when VGS is set to be high, power loss can be reduced, but on the other hand, VCC dependency may occur when VCC is lower than the set voltage.

Furthermore, when the techniques of Patent Document 2 or Patent Document 3 are used, the easiness and the degree of freedom accompanying the adjustment of the overcurrent determination voltage (Vref) may not be sufficiently obtained, and the overhead of a circuit area in a case in which the device is to be formed on a semiconductor substrate may become excessive. In Patent Document 4, study from the viewpoint of the dependency on the power supply voltage VCC has not been particularly done, and simply, a circuit that directly adds the gate/source voltage VGS to the current detection voltage Vidt as an offset voltage is shown.

The present invention has been accomplished in view of these circumstances, and an object of the present invention is to provide a secondary-battery monitoring device capable of realizing highly reliable overcurrent detection and a battery pack having it. Above and other objects and novel characteristics of the present invention will be apparent from the descriptions of the present specification and accompanying drawings.

The typical embodiments of the invention disclosed in the present application will be briefly described below.

In a secondary-battery monitoring device according to an embodiment, when an overcurrent flowing to a secondary battery is to be detected by utilizing a current detection voltage generated via on-resistance of charge-control and discharge-control FETs, a correction voltage having a characteristic that is varied by positive slope or negative slope approximating an slope of the detection voltage reduced along with increase in a power supply voltage is generated, and the correction voltage is added to the detection voltage or a reference power supply voltage with a polarity that cancels out the slope of voltage variation caused in the detection voltage and then input to a comparator circuit. As a result, input to the comparator circuit is corrected by the correction voltage, thereby reducing variations in an overcurrent determination current.

In a secondary-battery monitoring device according to an embodiment, when an overcurrent flowing to a secondary battery is to be detected by utilizing a current detection voltage generated via on-resistance of charge-control and discharge-control FETs, a correction voltage having a characteristic approximated by a linear function or a quadratic function to a characteristic of the detection voltage varied depending on a power supply voltage is generated, and the correction voltage is added to the detection voltage or a reference power supply voltage with a polarity that cancels out the slope of voltage variation caused in the detection voltage and then input to a comparator circuit. As a result, input to the comparator circuit is corrected by the correction voltage, thereby reducing variations in an overcurrent determination current.

Furthermore, in a secondary-battery monitoring device according to another embodiment, when an overcurrent flowing to a secondary battery is to be detected by utilizing a current detection voltage generated via on-resistance of charge-control and discharge-control FETs, the device includes means that generates a correction voltage having a characteristic that is increased by positive slope along with increase in a power supply voltage and means that generates a corrected detection voltage by adding the correction voltage to the detection voltage, a reference power supply voltage is applied to one side of a comparator circuit, and the corrected detection voltage is applied to the other side of the comparator circuit. As a result, input to the comparator circuit is corrected by the correction voltage, thereby reducing variations in an overcurrent determination current.

Also, in a secondary-battery monitoring device according to still another embodiment, when an overcurrent flowing to a secondary battery is to be detected by utilizing a current detection voltage generated via on-resistance of charge-control and discharge-control FETs, the device includes means that generates a correction voltage having a characteristic that is reduced by negative slope along with increase in a first power supply voltage and means that adds the correction voltage to a reference power supply voltage to generate a corrected reference voltage, the reference voltage corrected by the correction voltage is applied to one side of a comparator circuit, and a current detection voltage is applied to the other side of the comparator circuit. As a result, input to the comparator circuit is corrected by the correction voltage, thereby reducing variations in an overcurrent determination current.

Effects obtained by typical embodiments in the invention disclosed in the present application will be briefly described below. In a secondary-battery monitoring device and a battery pack having it, highly reliable overcurrent detection can be realized.

BRIEF DESCRIPTIONS OF THE DRAWINGS

FIG. 4A is a schematic drawing showing an example of an adjustment method of the characteristic of a corrected voltage in a case in which FIG. 3 is applied to FIG. 2A;

FIG. 4B is a schematic drawing showing an example of an adjustment method of the characteristic of a corrected voltage in a case in which FIG. 3 is applied to FIG. 2B;

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Circuit elements constituting functional blocks of the embodiments are not particularly limited, but for example, are formed on a semiconductor substrate such as a single-crystal silicon substrate by publicly-known CMOS (complementary MOS transistor) integrated circuit techniques.

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

Overall Configuration and Operation of Battery Pack

Figure 1A:
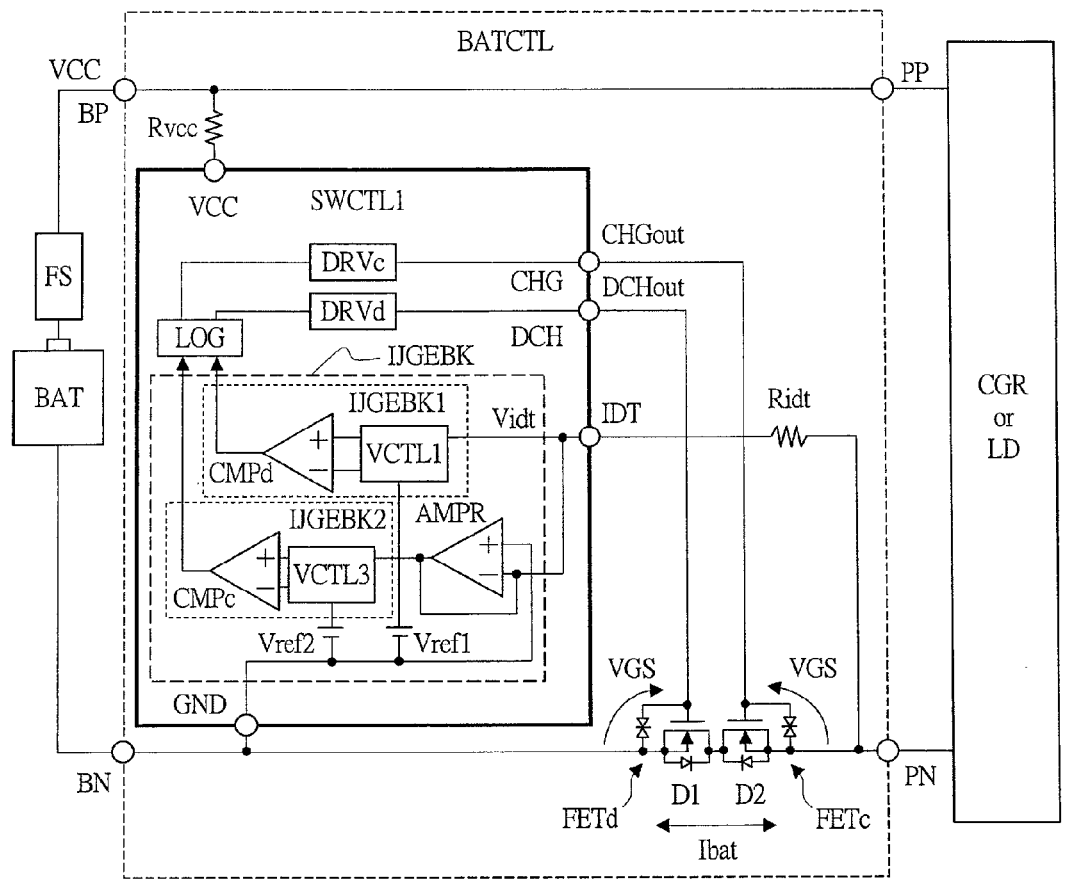
FIG. 1A is a schematic drawing showing a configuration example of a main part of a battery pack according to a first embodiment of the present invention.
Figure 1B:
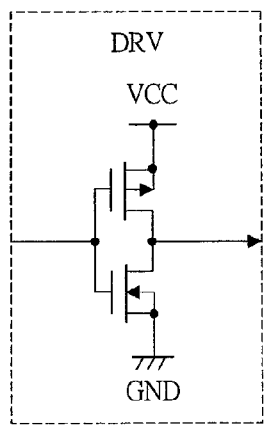
FIG. 1B is a schematic drawing showing a configuration example of a main part of the battery pack according to the first embodiment of the present invention.

FIG. 1A is a schematic drawing showing a configuration example of a main part of a battery pack according to a first embodiment of the present invention. The battery pack shown in FIG. 1 is provided with a secondary battery (battery) BAT, a fuse FS, and a secondary-battery monitoring device BATCTL which controls charging and discharging of BAT. BAT is typically a lithium-ion secondary battery. When a large current flows to BAT, the fuse FS shuts off the current path thereof to protect BAT. BATCTL is provided with a positive terminal BP and a negative terminal BN for connecting BAT and also a positive terminal PP and a negative terminal PN for connecting a charger CGR which charges BAT or a load circuit LD which is driven by BAT. A power supply voltage VCC from BAT is supplied to BP and a ground power supply voltage GND from BAT is supplied to BN. When CGR or LD is connected between PP and PN, current paths are respectively formed between BP and PP and between BN and PN.

The secondary-battery monitoring device BATCTL of this case is provided with a discharge-control switch FETd and a charge-control switch FETc inserted in series on the current path between the negative terminals BN and PN and a switch control unit SWCTL1 which controls on/off of these switches in accordance with the state of BAT. The discharge-control switch FETd and the charge-control switch FETc are made up of, for example, n-channel-type MOS field effect transistors, and sources and drains thereof are coupled in series on the current path between BN and PN. In this case, the source of FETd is coupled to BN (ground power supply voltage GND) and the drain of FETd is coupled to the drain of FETc. The source of FETc is coupled to the negative terminal PN. FETd and FETc are respectively provided with body diodes D1 and D2 having their anodes on a source side and their cathodes on a drain side in parallel to the sources and drains thereof. Though not particularly limited, SWCTL1 and the switches (FETd, FETc) are formed of different semiconductor chips, respectively, and mounted in a single package or on the same wiring board.

The switch control unit SWCTL1 is provided with an over-current determination block IJGEBK having an overcurrent protecting function, driver circuits DRVd and DRVc which drive gates of FETd and FETc, respectively, and a control logic circuit LOG which generates input signals of DRVd and DRVc in accordance with determination results of IJGEBK. SWCTL1 is operated using the power supply voltage VCC supplied from the positive terminal BP via a resistor Rvcc based on the ground power supply voltage GND supplied from the negative terminal BN serving as a reference voltage. For example, a driver circuit shown in FIG. 1B can be used as the driver circuits DRVd and DRVc.

The overcurrent determination block IJGEBK includes an overdischarge-current determination block IJGEBK1 and an overcharge-current determination block IJGEBK2. IJGEBK1 is provided with a voltage correction circuit VCTL1 according to the present invention in addition to a comparator circuit CMPd and a determination reference voltage Vref1. Similarly, the overcharge-current determination block IJGEBK2 is provided with a voltage correction circuit VCTL3 according to the present invention in addition to a comparator circuit CMPc and a determination reference voltage Vref2. VCTL3 has the same configuration as that of VCTL1 of IJGEBK1. In the following descriptions, the overdischarge-current determination block IJGEBK1 is taken as an example, but the overcharge-current determination block IJGEBK2 also has the same function as that of IJGEBK1. Note that, since a negative voltage is detected at the time of charging at an IDT terminal as a current detection voltage Vidt, the detected Vidt is applied to the overcharge-current determination block IJGEBK2 via an inversion amplifier circuit AMPR.

Although details thereof will be described later, the voltage correction circuit VCTL1 is a circuit which receives the current detection voltage Vidt and the determination reference voltage Vref1 and transmits them to two inputs of the comparator circuit CMPd, and also adds a predetermined correction voltage to either one of them in this transmission. Vidt is a voltage generated at the current detection terminal IDT coupled to the source of the charge-control switch FETc via a resistor Ridt, and has approximately the same electrical potential as the voltage at the source of FETc. CMPd determines the magnitude of the voltage input to one of two inputs (herein, positive node (+) side) based on a voltage applied to the other of the two inputs (herein, negative node (−) side) serving as a reference voltage. Resistors Rvcc and Ridt are provided for protecting SWCTL1 from, for example, external noise to be a cause of electrostatic breakdown, and have comparatively high resistance values.

In normal operation, the driver circuit DRVd in the switch control unit SWCTL1 carries out control to turn on the discharge-control switch FETd by a discharge control signal DCHout output from a discharge control terminal DCH, and the driver circuit DRVc carries out control to turn on the charge-control switch FETc by a charge control signal CHGout output from a charge control terminal CHG. At this time, the overcurrent determination block IJGEBK1 in SWCTL1 monitors a current Ibat which flows to the secondary battery BAT. Specifically, Ibat is converted to a voltage by utilizing on-resistance of FETd and FETc and the voltage is received as the above-described current detection voltage Vidt to carry out the monitoring.

The control logic circuit LOG outputs a control signal to the driver circuit DRVd when a state "voltage of positive node (+) side voltage of negative node (−) side" is detected by the comparator circuit CMPd. Upon receipt of the control signal, DRVd turns the discharge-control switch FETd in an off state to an on state. As a result, a discharge path of the secondary battery BAT is shut off, and only a charge path is formed by the body diode D1 of FETd and FETc in an on state.

In the overcharge-current determination block IJGEBK2, an output obtained by inverting, by the inversion amplifier circuit AMPR, a negative voltage detected as Vidt at the IDT terminal at the time of charging and the determination reference voltage Vref2 are input to the comparator circuit CMPc, and a correction voltage generated at the voltage correction circuit VCTL3 is added to either one of the inputs to the comparator circuit CMPc. Also in the descriptions of the following embodiments, an overdischarge-current protection circuit is similarly taken as an example in order to simplify the descriptions, but these can be applied also to an overcharge-current protection circuit. The voltage correction circuit VCTL according to the present invention may be applied to both of the overdischarge-current protection circuit and the overcharge-current protection circuit, or may be applied to either one of them while the other one is made to have a conventional circuit configuration.

<<Outline of Voltage Correction Circuit>>

Figure 2A:
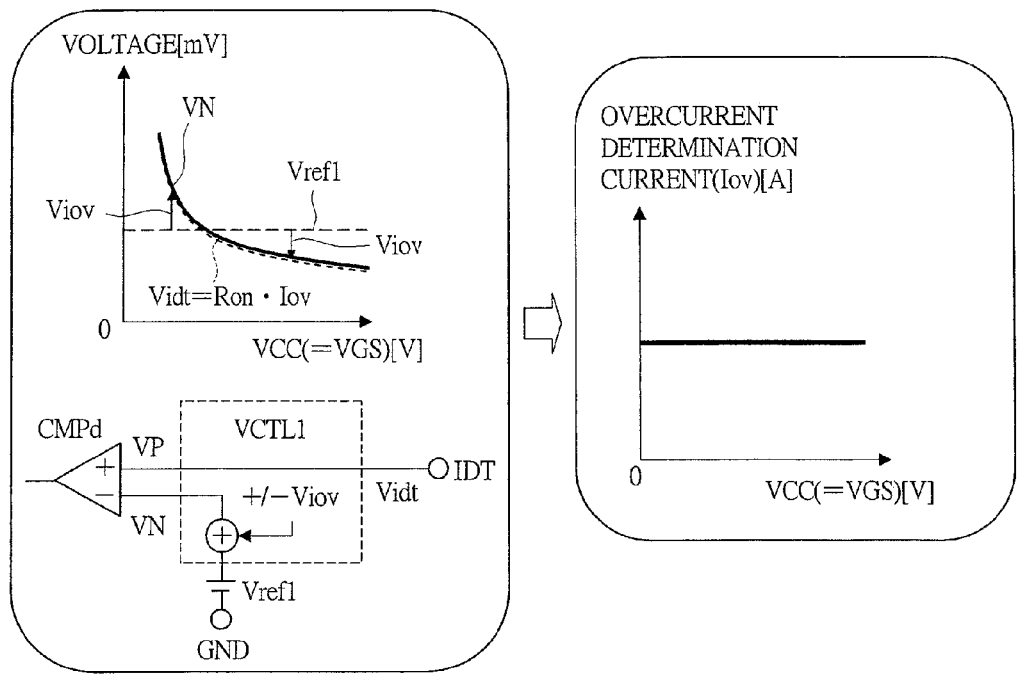
FIG. 2A is an explanatory drawing showing a schematic configuration example and an operation example of a voltage correction circuit of a switch control unit of FIG. 1.
Figure 2B:
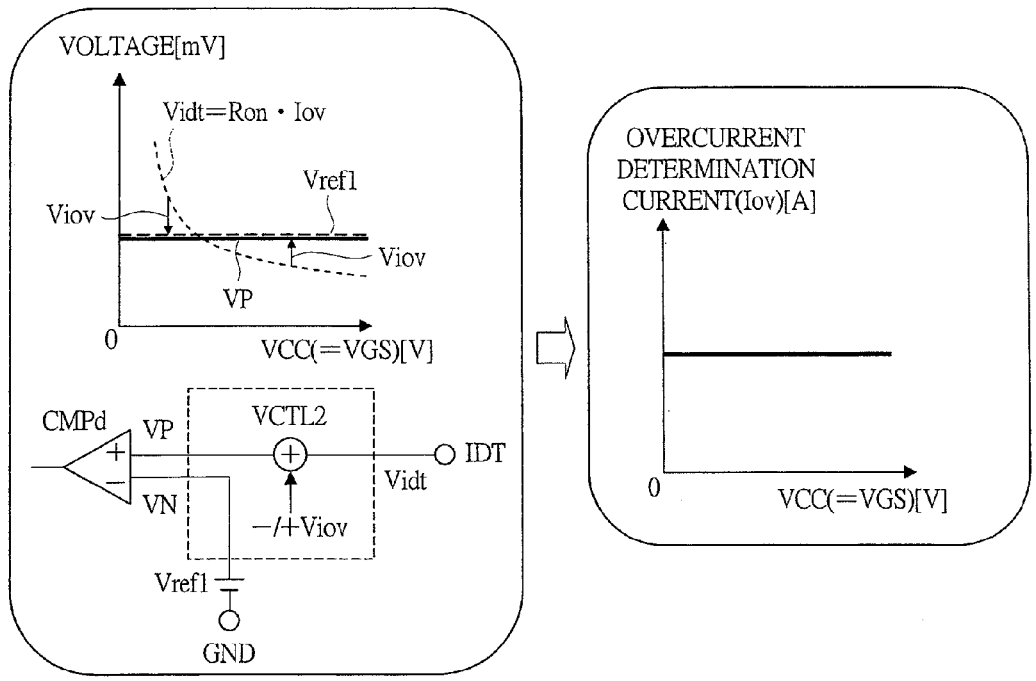
FIG. 2B is an explanatory drawing showing a schematic configuration example and an operation example of a voltage correction circuit of a switch control unit of FIG. 1.
Figure 18A:
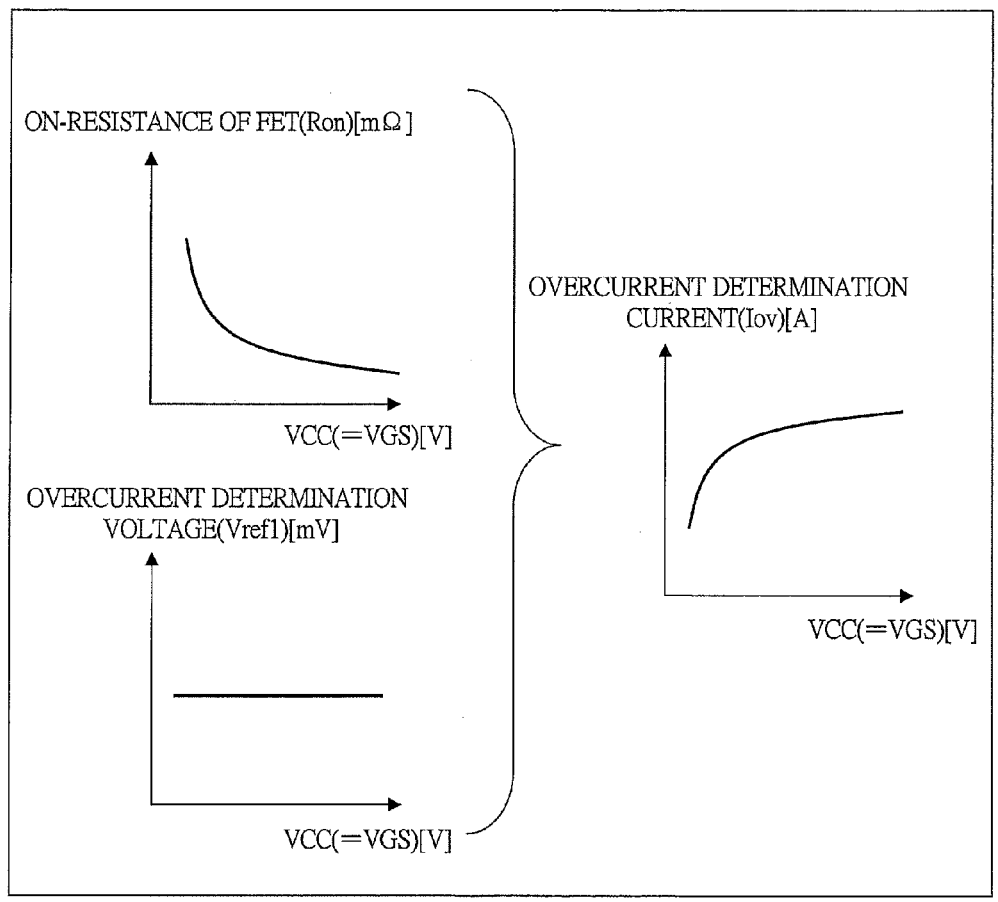
FIG. 18A is an explanatory drawing showing an example of the problem in the configuration example of FIG. 17A.

FIG. 2A and FIG. 2B are explanatory drawings showing schematic configuration examples and operation examples of the voltage correction circuit VCTL in the switch control unit SWCTL1 of FIG. 1. As described with reference to FIG. 18A, when an overcurrent is to be detected, the problem is that an overcurrent determination current Iov is varied in accordance with variations in VCC (that is, variations in VGS) due to dependency on variations in the power supply voltage VCC caused in the on-resistance (Ron) of the discharge-control switch FETd and the charge-control switch FETc (that is, dependency on variations in the gate/source voltage VGS). Operations in a case in which a correction voltage is applied between the negative node of the comparator circuit CMPd and the determination reference voltage Vref1 (constant) as shown in FIG. 2A in order to solve such a problem will be described. When the voltage of the positive node (+) of the comparator circuit CMPd is defined as VP and the voltage of the negative node (−) thereof is defined as VN, the voltage VP determined by Vidt=Ron×Iov is applied to the positive node of the comparator circuit CMPd, and the determination reference voltage VN is applied to the negative node. Here, in order to realize the conditions that make Iov constant without depending on VCC, in FIG. 2A, the voltage correction circuit VCTL1 carries out control to make VN match the current detection voltage Vidt by adding a predetermined correction voltage Viov which is dependent on VCC to the determination reference voltage Vref1 (constant).

The overcurrent determination current Iov can be made constant without depending on the power supply voltage VCC also by using a method as shown in FIG. 2B instead of that shown in FIG. 2A. In FIG. 2B, the voltage correction circuit VCTL2 adds the correction voltage Viov to the current detection voltage Vidt, thereby carrying out control to make a corrected voltage VP of the positive node (+) of the comparator circuit CMPd match the overcurrent determination voltage Vref1. However, in this case, Viov to be added has an opposite polarity.

More specifically, the correction voltage Viov having a characteristic that is varied by positive slope or negative slope along with increase in the power supply voltage is generated, the correction voltage having the polarity that cancels out the slope of the voltage variation caused in the detection voltage is added to the detection voltage or the reference power supply voltage, and then input to the comparator circuit. Therefore, as shown in FIGS. 2A and 2B, the polarity at the addition is determined in accordance with the slope of the variation of the generated correction voltage and whether it is to be added to the detection voltage or the reference power supply voltage. Note that addition of |Viov| to the negative node (−) side of CMPd is equivalent to subtraction of |Viov| from the positive node (+) side of CMPd, and subtraction of |Viov| from the negative node (−) side of CMPd is equivalent to addition of |Viov| to the positive node (+) side of CMPd.

Figure 3A:
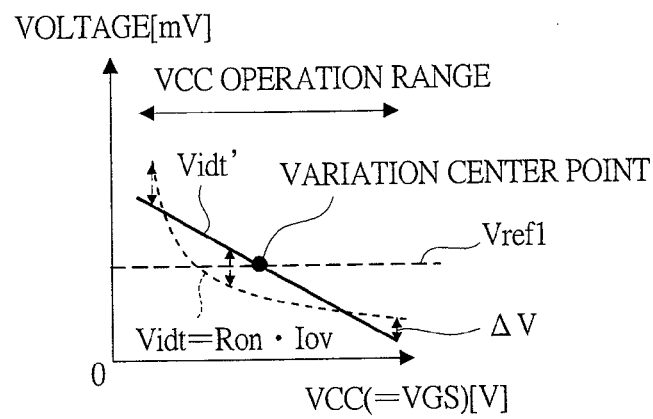
FIG. 3A is an explanatory drawing showing a different characteristic example of the current detection voltage of FIG. 2A and FIG. 2B.
Figure 3B:
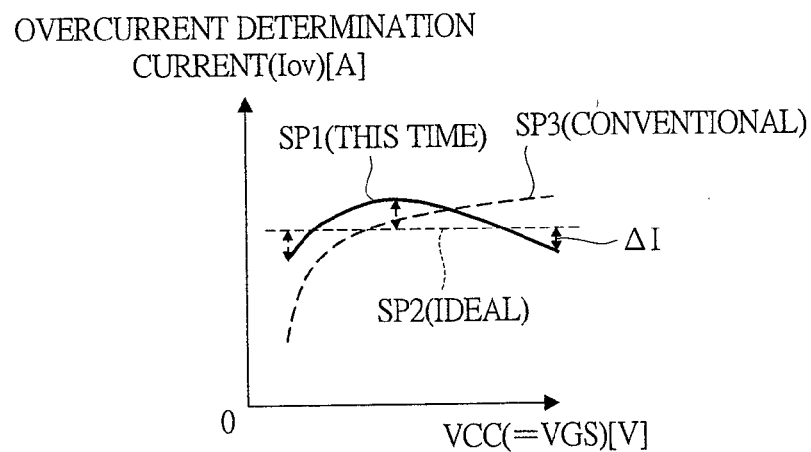
FIG. 3B is an explanatory drawing showing a characteristic example of an overcurrent determination current corresponding to the characteristic example of the current detection voltage of FIG. 3A.

FIG. 3A is an explanatory drawing showing another characteristic example of the current detection voltage of FIG. 2A and FIG. 2B, and FIG. 3B is an explanatory drawing showing a characteristic example of an overcurrent determination current corresponding to the characteristic example of the current detection voltage of FIG. 3A. For example, in FIG. 2A described above, in order to make the corrected voltage VN of the negative node (−) of the comparator circuit CMPd match the current detection voltage Vidt, the control of varying the correction voltage Viov in a curve in accordance with the power supply voltage VCC is desired, but a complex circuit and adjustment of circuit parameters may be required for carrying out such control. Therefore, in the embodiment shown in FIG. 3A, it is practical that the curve characteristic (Vidt) is approximated (first-order approximation) to a straight-line approximation characteristic (Vidt'), and then the characteristic of the corresponding corrected voltage VN (overcurrent detection voltage Viov) is determined based on that. By virtue of that, the overhead of a circuit area required for disposing the voltage correction circuit VCTL on a semiconductor substrate is reduced, and adjustment of circuit parameters is facilitated.

Figure 17A:
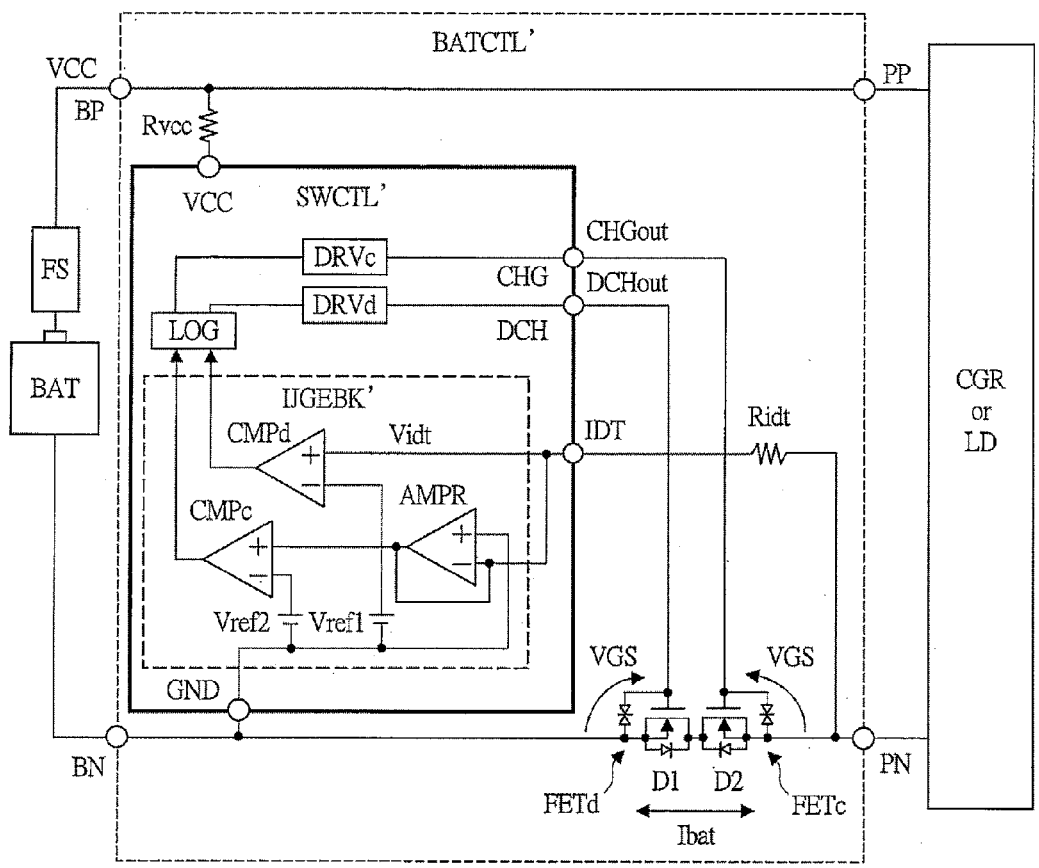
FIG. 17A is a schematic drawing showing a configuration example of a main part of a battery pack studied as a premise of the present invention.
Figure 17B:
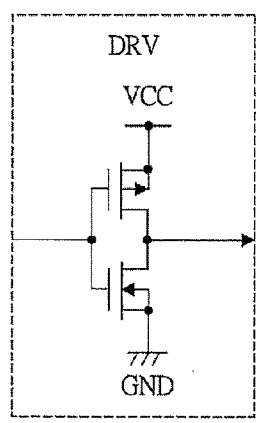
FIG. 17B is a circuit diagram showing a configuration example of a driver circuit of FIG. 17A.

As shown in FIG. 3A, when the curve characteristic (Vidt) is approximated to the straight-line characteristic (Vidt'), it is desired that the error (ΔV) between the two characteristics be as small as possible. As shown by a characteristic SP1 (first-order approximation characteristic shown in FIG. 3A) in FIG. 3B (dependency of the overcurrent determination current Iov on the power supply voltage VCC), the error (ΔV) appears as an error (ΔI) between SP1 and a characteristic SP2 (ideal characteristic at which the dependency on the power supply voltage VCC is zero). However, the error is significantly reduced compared with the curve characteristic SP3 shown in FIG. 18A, which is caused when the conventional overcurrent determination block IJGEBK' shown in FIG. 17 is used. In FIG. 3A, the error (ΔV) between the curve characteristic (Vidt) and the straight-line approximation characteristic (Vidt') can be minimized by, for example, determining the variation center point and slope (=Vidt'/VCC) by using a so-called least-square method in the section of the operating range (variation width) of VCC.

However, the shape of the curve characteristic (Vidt) is varied depending on on-resistance (Ron) characteristics (that is, characteristics dependent on the circuit parameters, configurations, or manufacturing conditions of FETd and FETc used as switches) and a set value of the overcurrent determination current Iov (that is, what level of current value is to be determined as an overcurrent). Therefore, in order to determine the straight-line approximation characteristic (Vidt') with a high degree of freedom in accordance with these various conditions and obtain the characteristic of the corrected voltage VN corresponding thereto, it is desired to provide the voltage correction circuit VCTL capable of increasing options in the circuit designing in which the slope and the variation center point of the overcurrent correction voltage Viov corresponding to Vidt' can be independently set as parameters. In the description above, the case of FIG. 2A is taken as an example, but the same is true of the case of FIG. 2B. Thus, when the straight-line approximation (first-order approximation) as shown in FIG. 3 is used for the configuration examples as shown in FIG. 2A and FIG. 2B, independent and selective setting of the above-described slope and the variation center point in circuit designing can be easily realized.

FIG. 4A is a schematic drawing showing an example of an adjustment method of the characteristic of the corrected voltage in a case in which the designing idea described in FIG. 3 is applied to FIG. 2A, and FIG. 4B is a schematic drawing showing an example of an adjustment method of the characteristic of the corrected voltage in a case in which the designing idea described in FIG. 3 is applied to FIG. 2B. The upper drawing of FIG. 4A shows voltage characteristics of various signals, and the lower drawing of FIG. 4A shows voltage characteristics focusing on an overcurrent correction voltage. Similarly, the upper drawing of FIG. 4B shows voltage characteristics of various signals, and the lower drawing of FIG. 4B shows voltage characteristics focusing on an overcurrent correction voltage.

In the upper drawing of FIG. 4A, first, a straight-line approximation characteristic (Vidt') serving as a target is determined in the manner described in FIG. 3A. The slope and the variation center point of Vidt' are varied depending on the on-resistance (Ron) and the set value of the overcurrent determination current Iov (what level of current value is to be determined as an overcurrent). Then, a variation center point (for example, a position corresponding to an intermediate point of a variation range of VCC on Vidt') is determined on the straight-line approximation characteristic (Vidt'), and the overcurrent determination voltage Vref1 is set on, for example, the variation center point. Then, in order to make Vref1 match Vidt', the characteristic of the overcurrent correction voltage Viov to be added to Vref1 is determined. As shown in the lower drawing of FIG. 4A, the characteristic of Viov is a characteristic that has negative slope having the same value as the negative slope of Vidt' and intersects with Vref1 at the variation center point on Vref1.

Also in the upper drawing of FIG. 4B, similarly, when a straight-line approximation characteristic (Vidt') serving as a target is determined, a variation center point is determined on Vidt', and an overcurrent determination voltage Vref1 is set on, for example, the variation center point. Then, in order to make Vidt' match Vref1, the characteristic of the overcurrent correction voltage Viov to be added to Vidt' is determined. As shown in the lower drawing of FIG. 4B, the characteristic of Viov is a characteristic that has positive slope of a reversed sign with the same absolute value as the slope of Vidt' in the upper drawing of FIG. 4B and intersects with Vidt' at the variation center point on Vidt'. In FIG. 4A and FIG. 4B, the slope characteristic of Viov with respect to the power supply voltage VCC can be easily set by utilizing, for example, a resistor voltage dividing circuit of VCC because straight-line approximation is used. Moreover, in the case of FIG. 4A, the variation center point of Viov can be set by adjusting the value of Vref1 and the intersecting point of Vref1 and Viov, and in the case of FIG. 4B, the variation center point of Viov can be set by adjusting the value of Vref1 and the intersecting point of Vidt' and Viov. As described above, when straight-line approximation (first-order approximation) like FIG. 3 is used with respect to the configuration examples of FIG. 2A and FIG. 2B in this manner, independent control of the slope and the variation center point of Viov can be easily realized.

On the other hand, the techniques of Patent Document 2 or Patent Document 3 use a system in which, so to speak, a voltage curve dependent on the power supply voltage VCC is formed in a fixed manner at the negative node (−) of the comparator circuit CMPd of FIG. 2A without using the overcurrent determination voltage Vref1 shown in FIG. 2A and FIG. 2B and the straight-line approximation (first-order approximation) shown in FIG. 3. As a result, adjustment of circuits and circuit parameters may become complex, and a problem of reduction in the degree of freedom in designing may occur.

For example, in the techniques of Patent Document 2, transistors having the same characteristics as the switch transistors (FETd, FETc) are provided as a correction circuit, and both of them have to be always used in combination. Therefore, there is a possibility that the degree of freedom in terms of mounting design may be lowered. Moreover, in the techniques of Patent Document 3, since the voltage curve of a negative node (−) of a comparator circuit CMPd is realized by a complex transistor circuit, there is a possibility that adjustment of circuit parameters which has to be carried out in accordance with the characteristics of the transistors used as switch transistors (FETd, FETc) becomes complex. Furthermore, there is some fear of the increase in circuit area in the techniques of Patent Document 3. On the other hand, when the voltage adjustment circuit constituted based on the design idea described in FIG. 2 and FIG. 3 is used, the detection conditions (correction characteristics) of overcurrent can be easily set with a high degree of freedom in accordance with the characteristics of the switch transistors (FETd, FETc), and highly reliable overcurrent detection can be realized.

<<Details of Voltage Correction Circuit>>

Figure 5A:
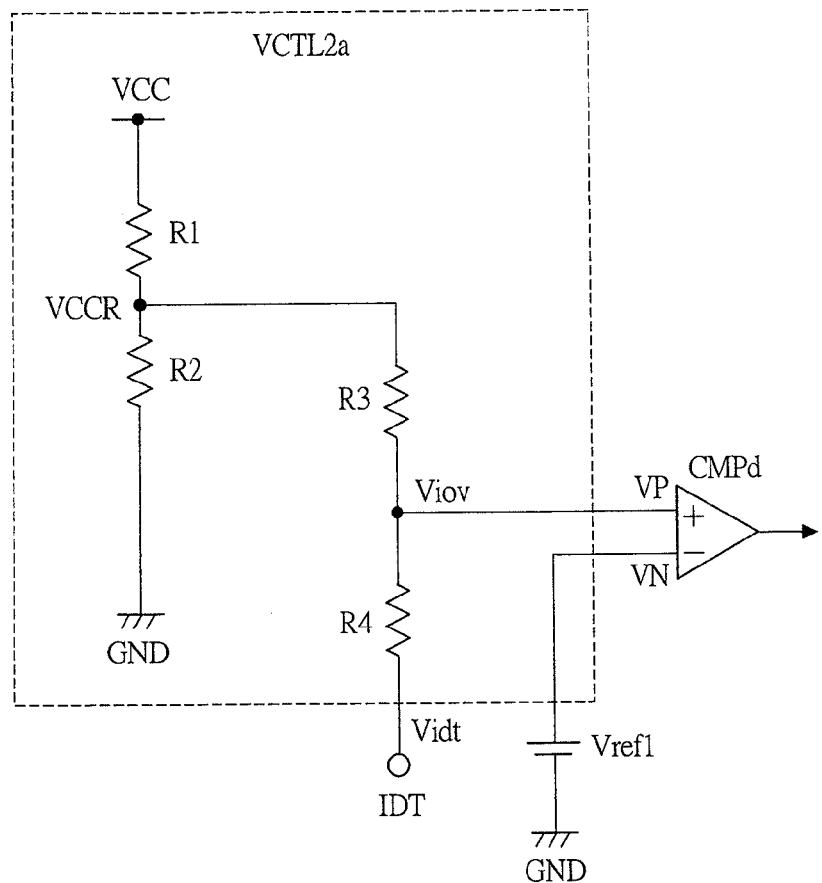
FIG. 5A is a circuit diagram showing a detailed configuration example of the voltage correction circuit of the switch control unit of FIG. 1.
Figure 6A:
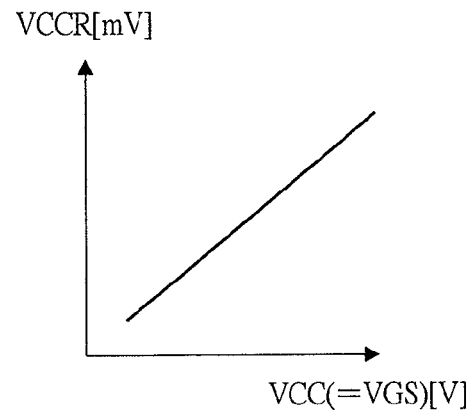
FIG. 6A is an explanatory drawing showing an operation example of the voltage correction circuit of FIG. 5A.
Figure 6B:
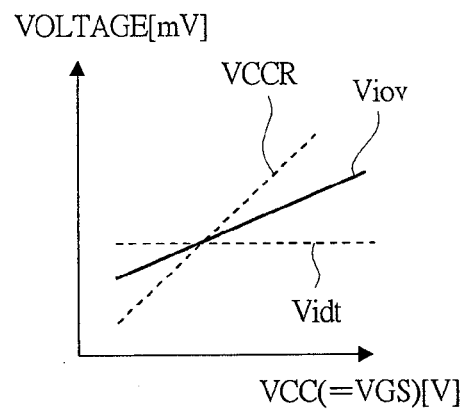
FIG. 6B is an explanatory drawing showing an operation example of the voltage correction circuit of FIG. 5A.
Figure 6C:
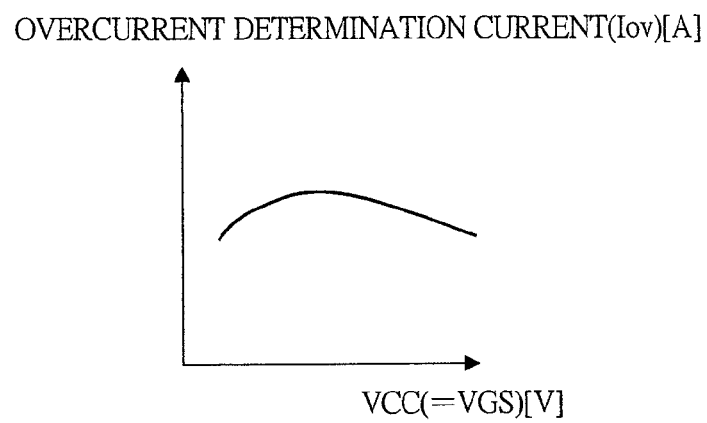
FIG. 6C is an explanatory drawing showing an operation example of the voltage correction circuit of FIG. 5A.

FIG. 5A is a circuit diagram showing a detailed configuration example of the voltage correction circuit VCTL in the switch control unit SWCTL1 of FIG. 1, and FIG. 5E is an explanatory drawing showing a characteristic example of an overcurrent correction voltage in FIG. 5A. FIG. 6A to 6C are explanatory drawings showing operation examples of the voltage correction circuit of FIG. 5A. A voltage correction circuit VCTL2a shown in FIG. 5A has a configuration example in which the straight-line approximation (first-order approximation) of FIG. 3 is applied to the above-described voltage correction circuit VCTL2 of FIG. 2B. VCTL2a is provided with resistors R1 and R2 which carry out resistor voltage division between the power supply voltage VCC and the ground power supply voltage GND and resistors R3 and R4 which carry out resistor voltage division between the resistor voltage dividing node thereof and the current detection terminal IDT. A voltage VCCR is generated at the resistor voltage dividing node of R1 and R2, an overcurrent correction voltage Viov is generated at the resistor voltage dividing node of R3 and R4, and the resistor voltage dividing node (Viov) is coupled to the positive node (+) of the comparator circuit CMPd. The overcurrent determination voltage Vref1 which has a fixed value is applied to the negative node (−) of CMPd.

When using the configuration example like this, as shown in FIG. 6A, a voltage VCCR having positive slope in accordance with the voltage-dividing ratio of the resistors R1 and R2 is generated along with the increase in the power supply voltage VCC. This VCCR is subjected to voltage division in accordance with the voltage-dividing ratio of the resistors R3 and R4 based on the current detection voltage Vidt at the current detection terminal IDT serving as a reference. As a result, as shown in FIG. 6B, when VCC (VCCR) is increased, the current that flows from R3 to R4 is increased, and the overcurrent correction voltage Viov having positive slope with respect to Vidt serving as a reference is generated. Thus, as described with reference to FIG. 2B and FIG. 4B, the VCC dependency of the overcurrent determination current Iov is reduced, and the characteristic of by as shown in FIG. 6C is obtained.

The operation in FIG. 5A is described in more detail below. First, the voltage level of the current detection terminal IDT is smaller than the voltage level of the voltage VCCR because the voltage level of the current detection terminal IDT is measured in unit of millivolt while the voltage level of the voltage VCCR is measured in unit of volt. Therefore, the IDT terminal can be effectively considered to be almost open, the voltage VCCR is determined by Equation (1), and the overcurrent correction voltage Viov is determined by Equation (2). When Equation (1) is substituted into Equation (2), Equation (3) is obtained.

$$VCCR=(R2/(R1+R2)) \times VCC \quad (1)$$

$$Viov=(VCCR-Vidt) \times (R4/(R3+R4))+Vidt \quad (2)$$

[Expression 1]

$$Viov = \left(\frac{R2}{R1+R2}\right)\left(\frac{R4}{R3+R4}\right)VCC + \left(\frac{R3}{R3+R4}\right)Vidt \quad (3)$$

Figure 5B:
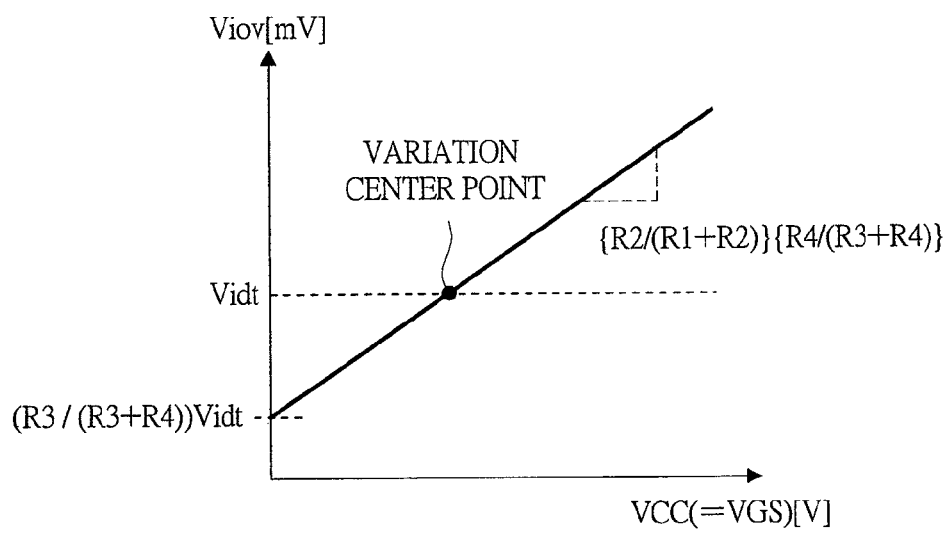
FIG. 5B is an explanatory drawing showing a characteristic example of an overcurrent correction voltage in FIG. 5A.

FIG. 5B shows the characteristic of the overcurrent correction voltage Viov obtained by Equation (3). As is understood from FIG. 5B, when the voltage correction circuit VCTL2a of FIG. 5A is used, the positive slope of Viov can be set by the values of the resistors R1 to R4. The "variation center point" (that is, the intersecting point of Vidt' (actually, Vidt) and Viov) described in FIG. 4B can be set by the values of the resistors R3 and R4 as is understood from FIG. 5B. In other words, each of the "variation center point" and the "slope" can be independently set. As a result, the characteristics of Viov in accordance with the characteristics of the on-resistance (Ron) of the switches (FETd, FETc), determination conditions of overcurrent (the value of the overcurrent determination current boy), and others can be easily set with a high degree of freedom.

On the other hand, for example, although it does not take the dependency on the power supply voltage VCC into consideration, Patent Document 4 shows a configuration in which gate voltage nodes of the switches (FETd, FETc) are directly connected to the resistor voltage dividing node (VCCR) in FIG. 5. In this case, even if the voltage value of the gate voltage node is the power supply voltage VCC, it is difficult to obtain the high degree of freedom as described in FIG. 5A and FIG. 5B. More specifically, in this case, setting of the "variation center point" and setting of the "slope" have to be carried out with using only the resistors R3 and R4 in common, and it is difficult to independently set each of them. Moreover, the configuration example of FIG. 5A can be realized in a small circuit area compared with the techniques of Patent Document 2 and Patent Document 3, and thus is beneficial also from this point.

As described above, when the secondary-battery monitoring device or the battery pack of the present first embodiment is used, typically, detection of an overcurrent with small errors can be carried out in accordance with the characteristics and others of the switches (FETd, FETc), and highly reliable overcurrent detection can be realized. Note that the circuit system in which the overcurrent correction voltage Viov having positive slope with respect to the current detection voltage Vidt serving as a reference is generated and is added to Vidt is used in FIG. 5A and FIG. 5B, but the circuit system can be arbitrarily changed. For example, a circuit system in which an overcurrent correction voltage having negative slope with respect to Vidt serving as a reference is generated and is subtracted from Vidt may be used.

Second Embodiment

Details of Voltage Correction Circuit

Modification Example [1]

Figure 7:
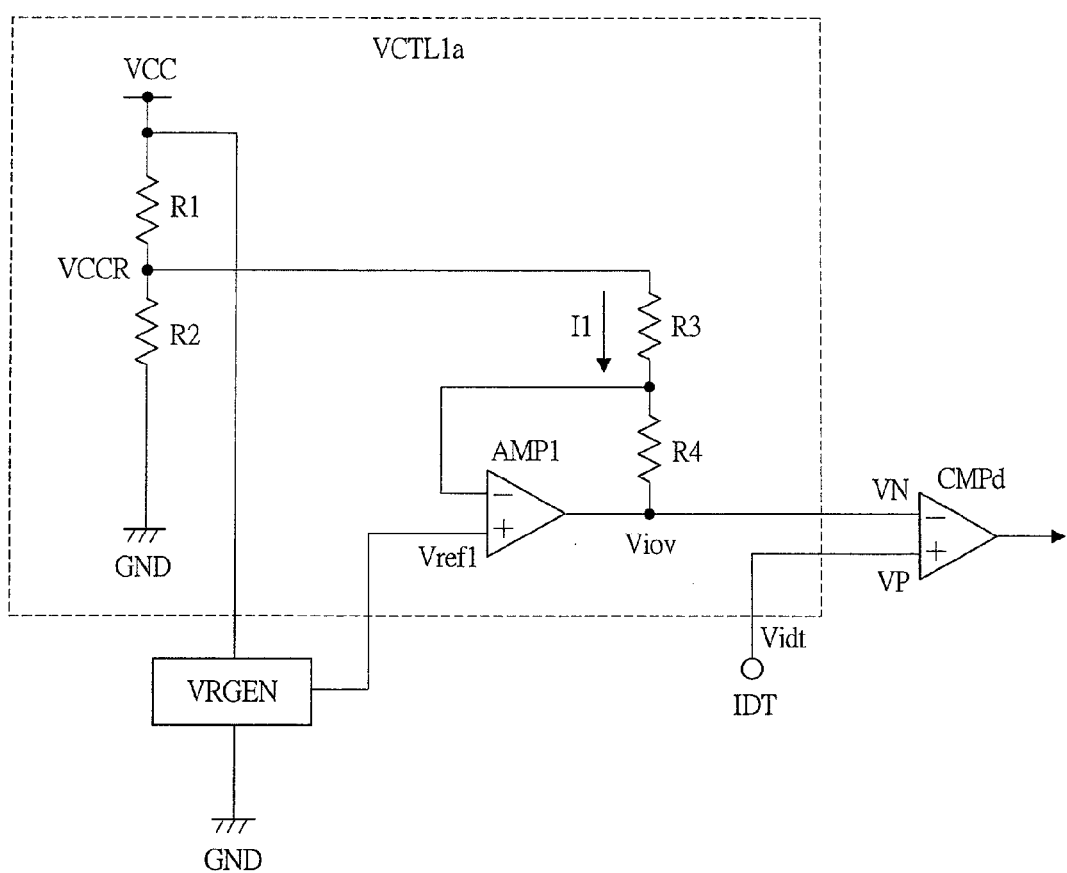
FIG. 7 is a circuit diagram showing a detailed configuration example of a voltage correction circuit of a secondary-battery monitoring device according to a second embodiment of the present invention.
Figure 8A:
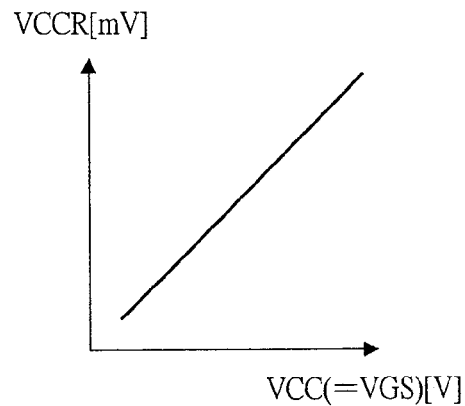
FIG. 8A is an explanatory drawing showing an operation example of the voltage correction circuit of FIG. 7.
Figure 8B:
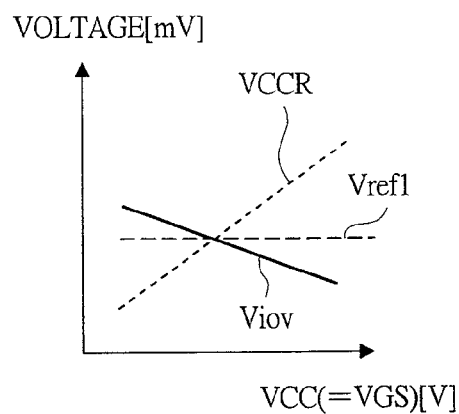
FIG. 8B is an explanatory drawing showing an operation example of the voltage correction circuit of FIG. 7.
Figure 8C:
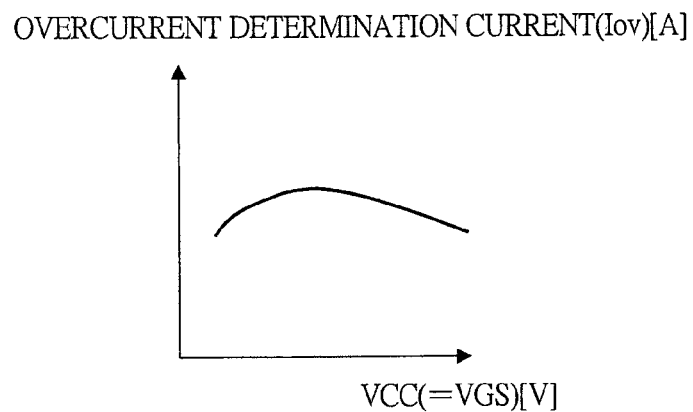
FIG. 8C is an explanatory drawing showing an operation example of the voltage correction circuit of FIG. 7.

FIG. 7 is a circuit diagram showing a detailed configuration example of a voltage correction circuit of a secondary-battery monitoring device according to a second embodiment of the present invention. FIG. 8A to FIG. 8C are explanatory drawings showing operation examples of the voltage correction circuit of FIG. 7. The voltage correction circuit VCTL1a shown in FIG. 7 has a configuration example in which the straight-line approximation (first-order approximation) of FIG. 3 is applied to the voltage correction circuit VCTL1 of FIG. 2A described above. VCTL1a is provided with the resistors R1 and R2 which carry out resistor voltage division between the power supply voltage VCC and the ground power supply voltage GND, the resistors R3 and R4 which carry out resistor voltage division between the resistor voltage dividing node thereof and the negative node (−) of the comparator circuit CMPd, and an amplifier circuit AMP1.

At the amplifier circuit AMP1, an overcurrent determination voltage Vref1 from a reference-voltage generating circuit (typically, a bandgap reference circuit) VRGEN is input to a positive node (+), the resistor voltage dividing node of the resistors R3 and R4 is coupled to a negative node (−), and a negative node (−) of the comparator circuit CMPd is coupled to an output node. The voltage VCCR is generated at the resistor voltage dividing node of the resistors R1 and R2, and the overcurrent correction voltage Viov is generated at the negative node (−) of CMPd. The current detection voltage Vidt from the current detection terminal IDT is input to the positive node (+) of CMPd.

When using the configuration example like this, as shown in FIG. 8A, a voltage VCCR having positive slope in accordance with the voltage-dividing ratio of the resistors R1 and R2 is generated along with the increase in the power supply voltage VCC. On the other hand, the amplifier circuit AMP1 sets the resistor voltage dividing node of the resistors R3 and R4 to the overcurrent determination voltage Vref1. Therefore, a current I1 that flows from R3 to R4 is increased along with the increase in VCC (VCCR), and as a result, the overcurrent correction voltage Viov having negative slope with respect to Vref1 serving as a reference is generated as shown in FIG. 8B. Thus, as described in FIG. 2A and FIG. 4A, VCC dependency of the overcurrent determination current Iov is reduced, and the characteristic of Iov as shown in FIG. 8C is obtained.

The operation in FIG. 7 is described in more detail below. First, the voltage VCCR is determined by Equation (4), and the current I1 that flows to the resistor R3 is determined by Equation (5). Also, the overcurrent correction voltage Viov is determined by Equation (6). Therefore, by reflecting Equation (4) and Equation (5) in Equation (6), Equation (7) is obtained.

$$VCCR=(R2/R1+R2))) \times VCC \quad (4)$$

$$I1=(VCCR-Vref1)/R3 \quad (5)$$

$$Viov=Vref1-(I1 \times R4) \quad (6)$$

[Expression 2]

$$Viov = \left(\frac{R2}{R1+R2}\right)\left(\frac{R4}{R3}\right)VCC + \left(\frac{R3+R4}{R3}\right)Vref1 \quad (7)$$

In the same manner as the above-described case of FIG. 5B (Equation (3)), as is understood from Equation (7), when the voltage correction circuit VCTL1a of FIG. 7 is used, the slope of the overcurrent correction voltage Viov can be set by the values of the resistors R1 to R4. Also, the "variation center point" (that is, the intersecting point of Vref1 and Viov) described in FIG. 4A can be set by the values of the resistors R3 and R4. In other words, each of the "variation center point" and the "slope" can be independently set. As a result, the characteristics of Viov in accordance with the characteristics of the on-resistance (Ron) of the switches (FETd, FETc), determination conditions of overcurrent (the value of the overcurrent determination current Iov), and others can be easily set with a high degree of freedom.

As described above, when the secondary-battery monitoring device of the present second embodiment is used, typically, detection of an overcurrent with small errors can be carried out in accordance with the characteristics and others of the switches (FETd, FETc), and highly reliable overcurrent detection can be realized. When the configuration example of FIG. 7 is compared with the configuration example of FIG. 5A, since the circuit area thereof is increased by the area corresponding to the amplifier circuit AMP1, the configuration example of FIG. 5A is desirable from this point of view. Moreover, the circuit system in which the overcurrent correction voltage Viov having negative slope with respect to the overcurrent determination voltage Vref1 serving as a reference is generated and is added to Vref1 is used in FIG. 7, but the circuit system can be arbitrarily changed. For example, a circuit system in which an overcurrent correction voltage having positive slope with respect to Vref1 serving as a reference is generated and is subtracted from Vref1 may be used.

Third Embodiment

Overall Configuration and Operation of Battery Pack

Modification Example

Figure 9A:
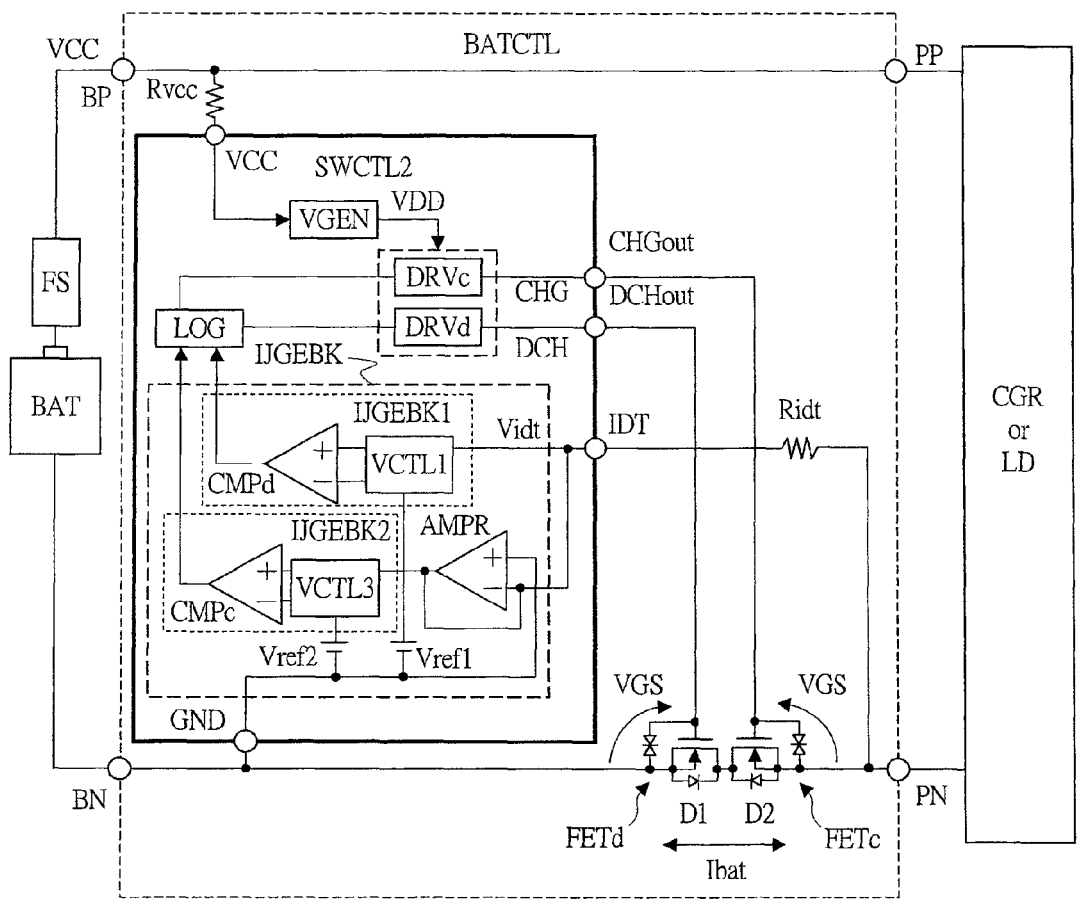
FIG. 9A is a schematic drawing showing a configuration example of a main part of a battery pack according to a third embodiment of the present invention.
Figure 9B:
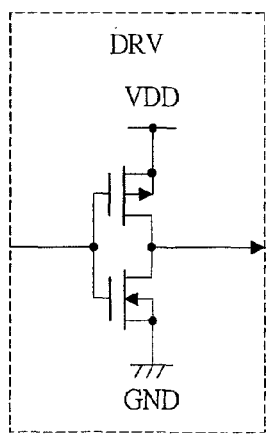
FIG. 9B is a schematic drawing showing a configuration example of a main part of the battery pack according to the third embodiment of the present invention.

FIGS. 9A and 9B are schematic drawings showing configuration examples of a main part of a battery pack according to a third embodiment of the present invention. The battery pack shown in FIGS. 9A and 9B is different from the battery pack of FIG. 1 in a point that a power-supply-voltage generating circuit VGEN is added into the switch control unit SWCTL2. Since the configuration other than this is similar to that of the case of FIG. 1, detailed description thereof will be omitted. The power-supply-voltage generating circuit VGEN receives the power supply voltage VCC from the secondary battery (battery) BAT and steps down VCC to generate a power supply voltage VDD. The power-supply-voltage generating circuit VGEN which generates VDD can be typically composed of a Zener diode or a step-down regulator circuit. VDD thereof is supplied to the driver circuits DRVc and DRVd as a power supply voltage.

Figure 10A:
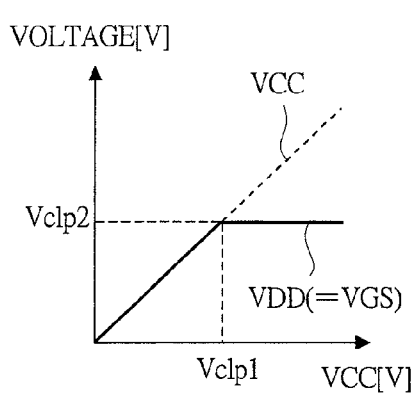
FIG. 10A is an explanatory drawing showing a schematic operation example of a switch control unit of FIG. 9.
Figure 10B:
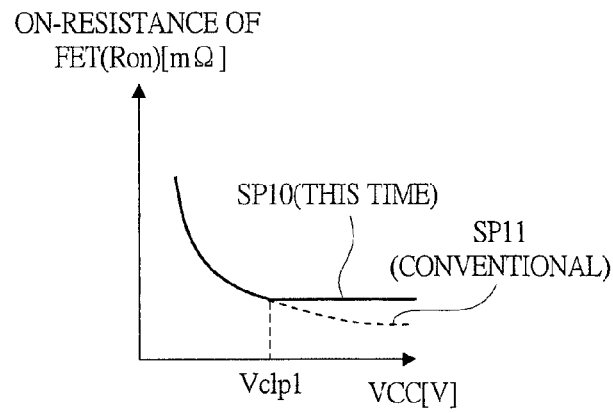
FIG. 10B is an explanatory drawing showing a schematic operation example of the switch control unit of FIG. 9.

FIG. 10A to FIG. 10D are explanatory drawings showing schematic operation examples of the switch control unit of FIG. 9. First, as shown in FIG. 10A, the power-supply-voltage generating circuit VGEN generates the power supply voltage VDD which is increased in proportion to the increase in VCC until the power supply voltage VCC reaches a predetermined clamping voltage Vclp1. However, after VCC reaches Vclp1, the circuit generates VDD which has a voltage value of a predetermined clamping voltage Vclp2 without depending on the increase in VCC. Then, when the configuration example shown in FIG. 9B is used as the driver circuits DRVc and DRVd, as shown by a characteristic SP10 of FIG. 10B, the on-resistance (Ron) of the switches (FETd, FETc) has a constant value without depending on the increase in VCC after VCC reaches Vclp1. Note that SP11 corresponds to the curve in the upper left drawing of FIG. 18A.

When the on-resistance (Ron) of the switches (FETd, FETc) becomes constant in this manner, the above-described dependency of the overcurrent determination current Iov on the power supply voltage VCC is eliminated. Patent Document 1 described above shows a system that makes Ron constant in this manner. However, in this case, since the clamping voltage Vclp1 (and Vclp2 corresponding thereto) has to be set to, for example, the lowest value of the variation range of VCC in order to eliminate the VCC dependency of boy, in actual operation, Ron is fixed at a high value, and power loss may occur due to that. Therefore, in the present third embodiment, Vclp1 (and Vclp2 corresponding thereto) is set to a high value to some extent (for example, an intermediate value in the variation range of VCC), and the VCC dependency of by which may be caused in the range of VCC<Vclp1 due to that is reduced by the above-described system of the first embodiment or the second embodiment.

Figure 10C:
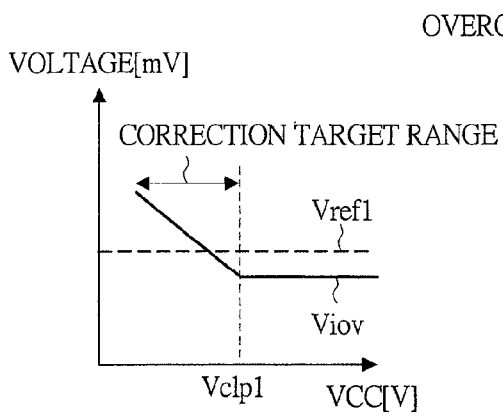
FIG. 10C is an explanatory drawing showing a schematic operation example of the switch control unit of FIG. 9.
Figure 10D:
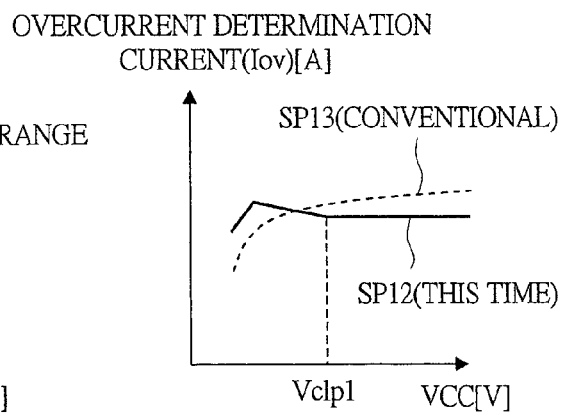
FIG. 10D is an explanatory drawing showing a schematic operation example of the switch control unit of FIG. 9.

In this case, as shown in FIG. 10C, in the range of VCC<Vclp1, the overcurrent correction voltage Viov is controlled to have negative slope (in the case of FIG. 4A) or positive slope (in the case of FIG. 4B) along with the increase in the power supply voltage VCC, and in the range of VCC≥Vclp1 (VDD=Vclp2), the overcurrent correction voltage Viov is controlled to be constant. As a result, as shown by a characteristic SP12 of FIG. 10D, the VCC dependency of the overcurrent determination current Iov is reduced. At this time, as shown in FIG. 10C, the correction target range (range in which straight-line approximation is carried out) can be narrowed compared with the case of FIG. 3A. As a result, errors in straight-line approximation can be reduced in comparison with the case of FIG. 3A, and as a result, the VCC dependency of by can be reduced compared with the case of the first embodiment or the second embodiment. However, from the viewpoint of power loss associated with on-resistance (Ron), the system of the first embodiment or the second embodiment is more desirable. Note that SP13 in FIG. 10D corresponds to the curve shown in the right of FIG. 18A.

<<Details of Configuration Around Voltage Correction Circuit and Driver Circuit>>

Figure 11:
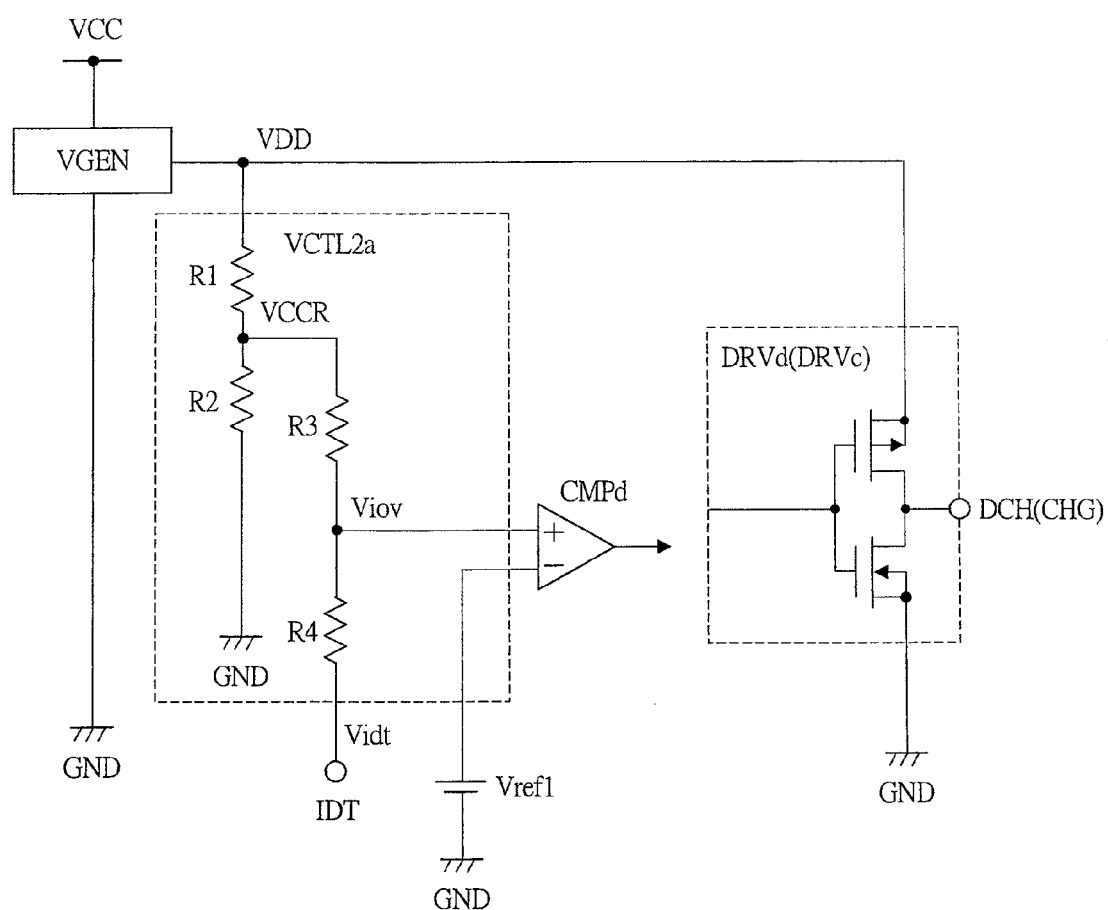
FIG. 11 is a circuit diagram showing a detailed configuration example around a voltage correction circuit and a driver circuit of the switch control unit of FIG. 9.

FIG. 11 is a circuit diagram showing a detailed configuration example around the voltage correction circuit VCTL and the driver circuit DRV in the switch control unit SWCTL2 of FIG. 9. FIG. 12A to FIG. 12D are explanatory drawings showing operation examples of the voltage correction circuit of FIG. 11. FIG. 11 shows the configuration example in which the voltage correction circuit VCTL2a shown in FIG. 5A is combined with the power-supply-voltage generating circuit VGEN and the driver circuits DRVd and DRVc described in FIG. 9. The power supply voltage VDD from VGEN is supplied to DRVd and DRVc as a power supply voltage and is also supplied to one end of the resistor R1 in VCTL2a instead of the power supply voltage VCC shown in FIG. 5A.

Figure 12A:
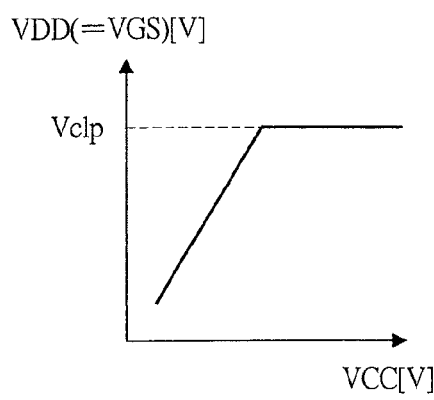
FIG. 12A is an explanatory drawing showing an operation example of the voltage correction circuit of FIG. 11.
Figure 12B:
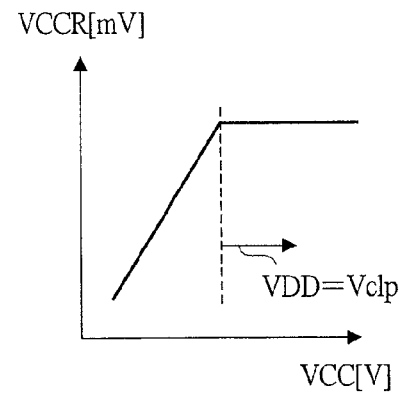
FIG. 12B is an explanatory drawing showing an operation example of the voltage correction circuit of FIG. 11.
Figure 12C:
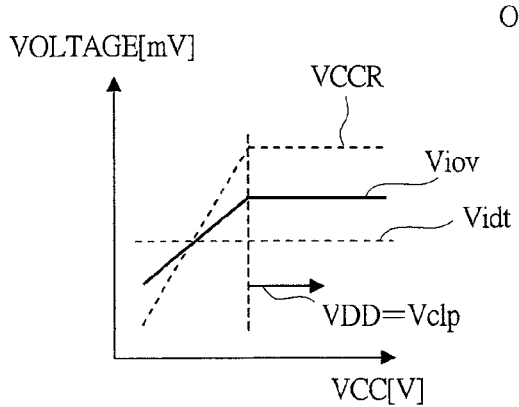
FIG. 12C is an explanatory drawing showing an operation example of the voltage correction circuit of FIG. 11.
Figure 12D:
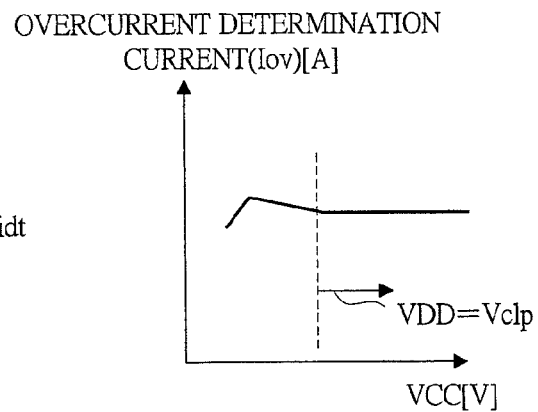
FIG. 12D is an explanatory drawing showing an operation example of the voltage correction circuit of FIG. 11.

When using the configuration example like this, as shown in FIG. 12A, the power supply voltage VDD is increased in proportion to the increase in the power supply voltage VCC until reaching a clamping voltage Vclp, and the power supply voltage VDD is fixed to the voltage value of Vclp after reaching Vclp. In response to this, as shown in FIG. 12B, in the range of VDD<Vclp, the voltage VCCR of the resistor voltage dividing node of the resistors R1 and R2 is also increased in accordance with the resistance ratio of R1 and R2 in proportion to the increase in VCC, and in the range of VDD=Vclp, VCCR is fixed to Vclp×(R2/(R1+R2)). In response to this, as shown in FIG. 12C, in the range of VDD<Vclp, the overcurrent correction voltage Viov is increased in proportion to the increase in VCC by positive slope with respect to the current detection voltage Vidt serving as a reference, and in the range of VDD=Vclp, Viov has a constant value. As a result, as shown in FIG. 12D, the VCC dependency of the overcurrent determination current Iov is reduced.

Details of Configuration Around Voltage Correction Circuit and Driver Circuit

Modification Example

Figure 13:
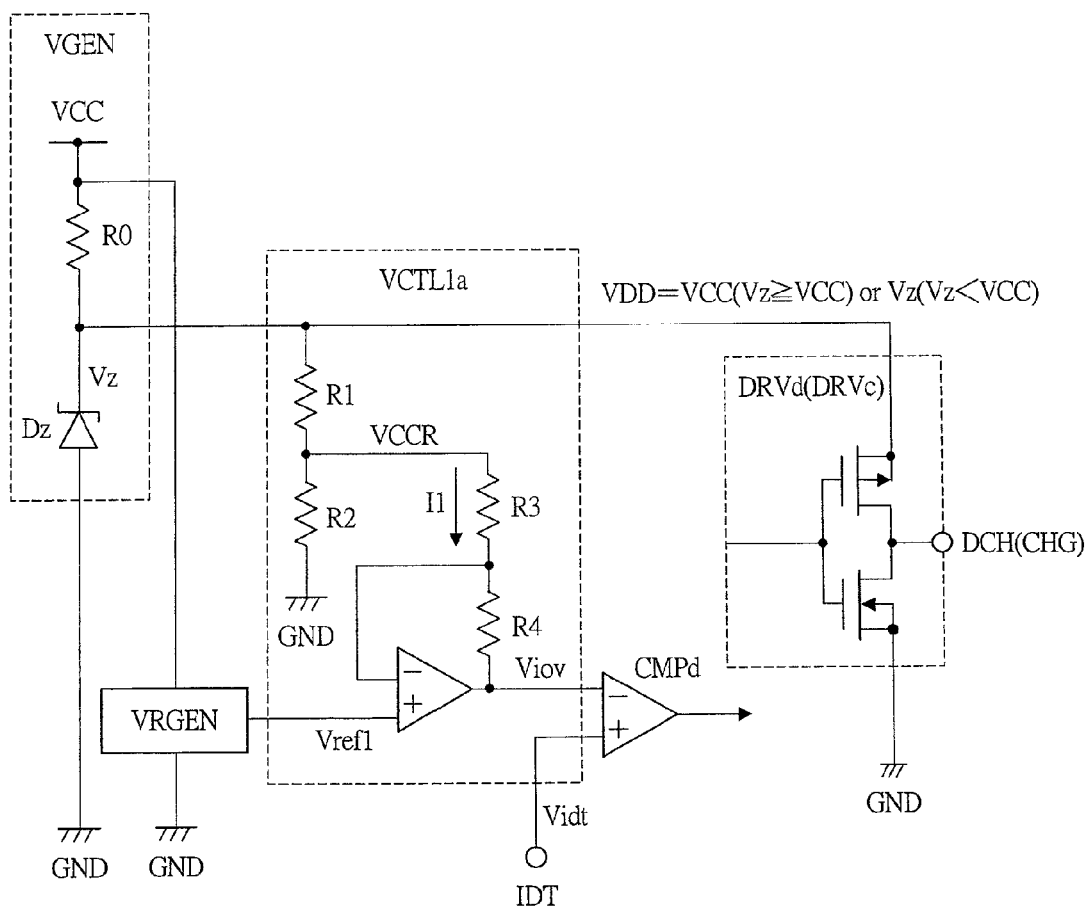
FIG. 13 is a circuit diagram showing another detailed configuration example around the voltage correction circuit and the driver circuit of the switch control unit of FIG. 9.
Figure 14A:
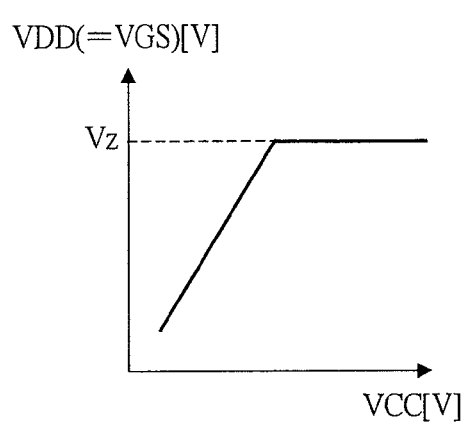
FIG. 14A is an explanatory drawing showing an operation example of the voltage correction circuit of FIG. 13.
Figure 14B:
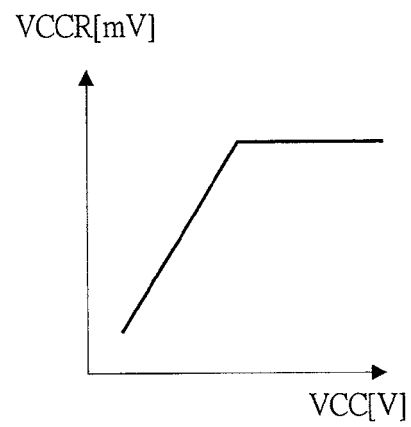
FIG. 14B is an explanatory drawing showing an operation example of the voltage correction circuit of FIG. 13.
Figure 14C:
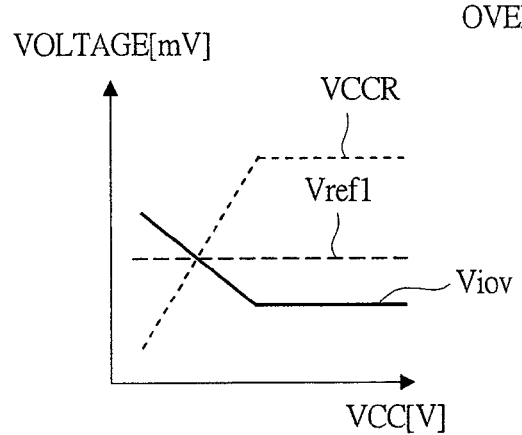
FIG. 14C is an explanatory drawing showing an operation example of the voltage correction circuit of FIG. 13.
Figure 14D:
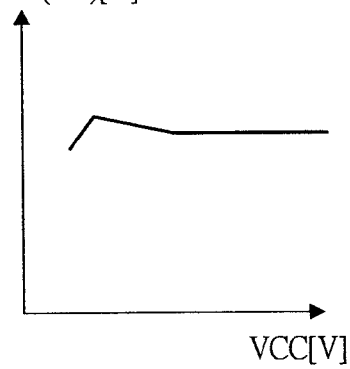
FIG. 14D is an explanatory drawing showing an operation example of the voltage correction circuit of FIG. 13.

FIG. 13 is a circuit diagram showing another detailed configuration example around the voltage correction circuit VCTL and the driver circuit DRV in the switch control unit SWCTL2 of FIG. 9. FIG. 14A to FIG. 14D are explanatory drawings showing operation examples of the voltage correction circuit of FIG. 13. FIG. 13 shows the configuration example in which the voltage correction circuit VCTL1a shown in FIG. 7 is combined with the power-supply-voltage generating circuit VGEN and the driver circuits DRVd and DRVc described in FIG. 9. The power supply voltage VDD from VGEN is supplied to DRVd and DRVc as a power supply voltage and is supplied also to one end of the resistor R1 in VCTL1a instead of the power supply voltage VCC shown in FIG. 7. In this case, VGEN is made up of a clamp circuit including a series circuit of a resistor R0 and a Zener diode Dz, and the power supply voltage VDD is generated from the connection node (cathode of Dz) of R0 and Dz.

As shown in FIG. 14A to FIG. 14D, the operations in the configuration example of FIG. 13 are almost the same as those shown in FIG. 12A to FIG. 12D described above. Differences from FIG. 12A to FIG. 12D are a point that the clamping voltage Vclp is replaced by a Zener voltage Vz of the Zener diode Dz and a point that the characteristic of the overcurrent correction voltage Viov is changed to be lowered in proportion to the increase in the power supply voltage VCC by negative slope with respect to the overcurrent determination voltage Vref1 serving as a reference.

As described above, when the secondary-battery monitoring device or the battery pack of the present third embodiment is used, typically, detection of overcurrents with small errors can be carried out in accordance with the characteristics and others of the switches (FETd, FETc), and highly reliable overcurrent detection can be realized.

Fourth Embodiment

Figure 15:
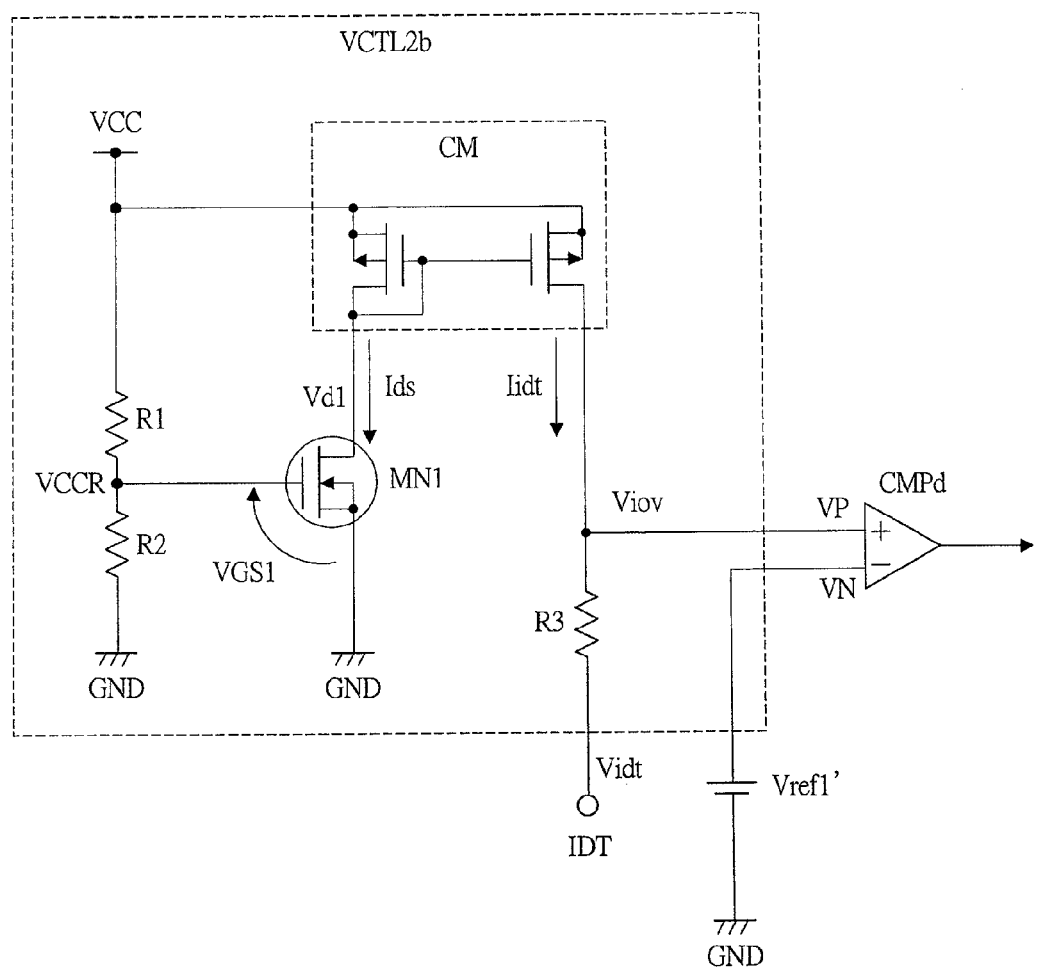
FIG. 15 is a circuit diagram showing a detailed configuration example of a voltage correction circuit of a secondary-battery monitoring device according to a fourth embodiment of the present invention.

FIG. 15 is a circuit diagram showing a detailed circuit configuration example of a voltage correction circuit of a secondary-battery monitoring device according to a fourth embodiment of the present invention. The voltage correction circuit VCTL2b shown in FIG. 15 corresponds to the above-described voltage correction circuit VCTL2 of FIG. 2B, and has a configuration example in which an overcurrent determination voltage Vref1' is applied to the negative node (−) of the comparator circuit CMPd and the overcurrent correction voltage Viov is added to the positive node (+) thereof.

VCTL2b of FIG. 15 is provided with the resistors R1 and R2 which carry out resistor voltage division of the power supply voltage VCC, an NMOS transistor MN1 which operates with using the voltage of the resistor voltage dividing node as a gate/source voltage VGS1, a current mirror circuit CM which transfers the source/drain current (Ids) of MN1, and the resistor R3. One end of R3 is coupled to the current detection terminal IDT, and a current (Iidt) transferred by CM is supplied from the other end thereof. The other end of R3 is coupled to the positive node (+) of CMPd and serves as a generation node of Viov.

Figure 16A:
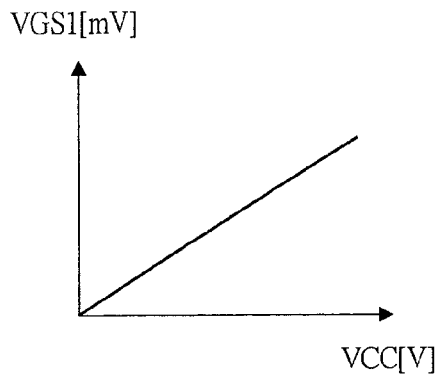
FIG. 16A is an explanatory drawing showing an operation example of the voltage correction circuit of FIG. 15.
Figure 16B:
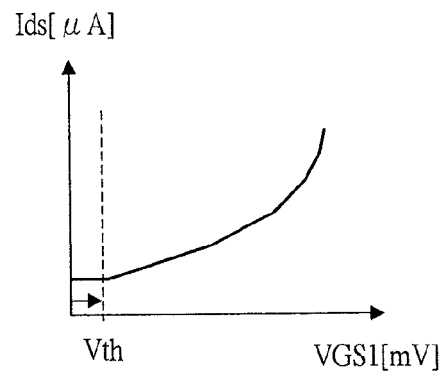
FIG. 16B is an explanatory drawing showing an operation example of the voltage correction circuit of FIG. 15.
Figure 16C:
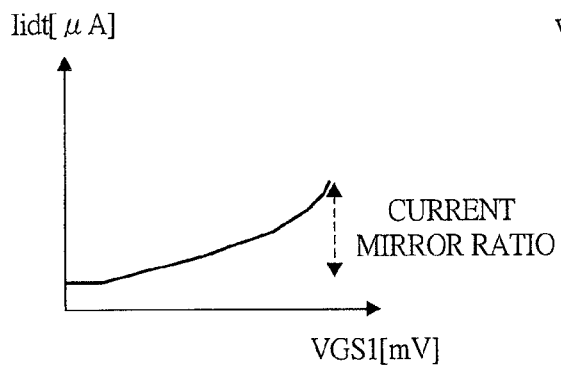
FIG. 16C is an explanatory drawing showing an operation example of the voltage correction circuit of FIG. 15.
Figure 16D:
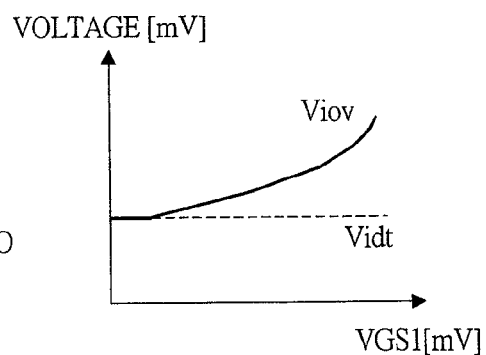
FIG. 16D is an explanatory drawing showing an operation example of the voltage correction circuit of FIG. 15.

FIG. 16A to FIG. 16E are explanatory drawings showing operation examples of the voltage correction circuit VCTL2b of FIG. 15. As shown in FIG. 16A, when the power supply voltage VCC is increased, the gate/source voltage VGS1 of the NMOS transistor MN1 is increased in accordance with the ratio of the resistors R1 and R2. In response to this, as shown in FIG. 16B, MN1 generates the source/drain current (Ids) which is increased in accordance with the increase in VGS1 by a square curve thereof. As shown in FIG. 16C, this Ids is transferred as a current (Iidt) in accordance with the current mirror ratio of the current mirror circuit CM (in this case, the transistor size ratio of two PMOS transistors). Iidt is converted to a voltage by the resistor R3, and as shown in FIG. 16D, the overcurrent correction voltage Viov increased by positive slope in accordance with the increase in VCC is added to the current detection voltage Vidt at the current detection terminal IDT.

Figure 16E:
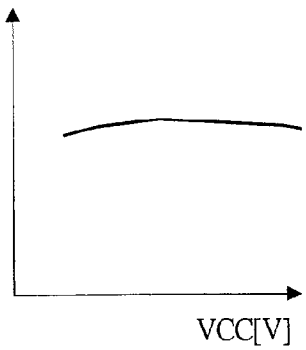
FIG. 16E is an explanatory drawing showing an operation example of the voltage correction circuit of FIG. 15.
Figure 18B:
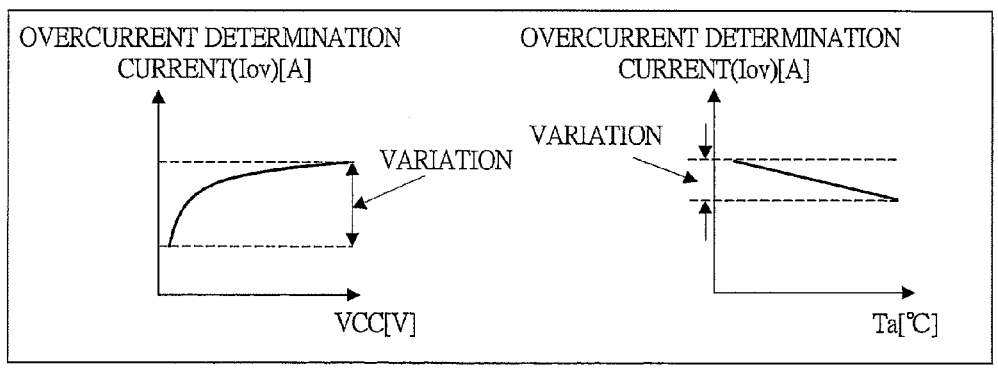
FIG. 18B is an explanatory drawing showing an example of the problem in the configuration example of FIG. 17A.

In this manner, as shown in FIG. 16E, the dependency of the overcurrent determination current Iov on the power supply voltage VCC is reduced like the cases of FIG. 2B and FIG. 4B. However, in this case, the overcurrent correction voltage Viov like a curve (square function) is generated without using straight-line approximation (first-order approximation) like the case of FIG. 4B. Since the on-resistance (Ron) of the switches (FETc and FETd) has a characteristic like a curve (quadratic function) in practice as shown in FIG. 3A and others, the VCC dependency of by can be reduced in some cases by generating Viov like a curve (quadratic function) corresponding to this, compared with the case in which straight-line approximation like FIG. 3 and others is carried out. Moreover, since the NMOS transistor MN1 is used, temperature dependency as described in FIG. 18B can be reduced to some extent.

Details of the operation of the configuration example of FIG. 15 will be described below. First, the voltage VCCR is determined by Equation (8), and the current (Ids) that flows to the NMOS transistor MN1 is determined by Equation (9) with using a gate width (W)/a gate length (L), electron mobility μ, unit gate capacitance Cox, and a threshold value Vth of MN1.

$$VCCR = (R2/(R1+R2)) \times VCC \quad (8)$$

[Expression 3]

$$Ids = \frac{1}{2} \frac{W}{L} \mu Cox (VGS1 - Vth)^2 \quad (9)$$

Also, the transfer current (Iidt) of the current mirror circuit CM is determined by Equation (10) with using the current mirror ratio (A/B). Therefore, the overcurrent determination voltage Viov is determined by Equation (11). By reflecting Equation (8) to Equation (10) in Equation (11), Equation (12) is obtained.

$$Iidt = Ids \times (A/B) \quad (10)$$

$$Viov = Iidt \times R3 + Vidt \quad (11)$$

$$Viov = \frac{1}{2}\frac{W}{L}\mu Cox\left\{\left(\frac{R2}{R1+R2}\right)VCC - Vth\right\}^2 \times A/B \times R3 + Vidt \quad (12)$$

As is understood from Equation (12), the characteristic of the overcurrent correction voltage Viov can be adjusted by the resistors R1 and R2, various parameters of the NMOS transistor MN1 to be used, the current mirror ratio (A/B) of the current mirror circuit CM, and the resistor R3. Therefore, adjustment can be carried out with a high degree of freedom. However, when compared with the case in which the above-described straight-line approximation (first-order approximation) is used, there is a possibility that the circuit may become complex or the adjustment of circuit parameters may become complex. Also, the circuit area thereof may be slightly increased. From these points of view, it is desired to apply the system using straight-line approximation like the first to third embodiments.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiments described above, the configuration examples in which the switches for charge control and discharge control are inserted in the current path on the negative terminal side of the secondary battery BAT have been shown. However, for example, a configuration in which the switches are inserted in the current path on the positive terminal side thereof is also conceivable, and the present embodiments can be similarly applied also to such a configuration.

The battery pack according to the present embodiments can be widely applied to battery-equipped general devices typified by lithium ion secondary-battery packs used in mobile devices such as mobile phones including notebook computers, automobiles, and others.

What is claimed is:

1. A secondary-battery monitoring device comprising:
first and second battery connection terminals to which a secondary battery is to be connected;
first and second external terminals to which a load or a charger is to be connected;
a first current path arranged between the first battery connection terminal and the first external terminal;
a second current path arranged between the second battery connection terminal and the second external terminal;
a switch circuit including a pair of FETs that control a flow of a discharge current and a flow of a charge current, respectively, the switch circuit being inserted in the second current path so as to control the charge current and the discharge current flowing in the secondary battery; and
a switch control unit,
wherein the switch control unit is provided with:
a second power-supply terminal connected to the second current path at a line connecting the second battery connection terminal and one node on the second current path of the switch circuit;
a first power-supply terminal to which a first power supply voltage from the secondary battery is supplied via the first current path with using a voltage at the second power-supply terminal as a reference;
a pair of control terminals;
driver circuits configured to supply control voltages to gates of corresponding FETs via the control terminals;
a detection terminal connected to the second current path at a line connecting the other node on the second current path of the switch circuit and the second external terminal;
a first detection circuit configured to monitor the charge current flowing in the second current path based on a detection voltage detected at the detection terminal, and output a detection signal when the detection voltage reaches a predetermined value;
a second detection circuit configured to monitor the discharge current and output a detection signal when the detection voltage reaches a predetermined value; and
a control circuit configured to supply the control voltage via the corresponding driver circuit in response to the detection signal to carry out control of shutting off the corresponding FET, and
wherein at least one of the first and second detection circuits is provided with:
a comparator circuit configured to determine, based on a voltage of one input node of the comparator circuit serving as a reference voltage, magnitude of a voltage of the other input node of the comparator circuit to output the detection signal based on a result of the determination; and
a voltage correction circuit configured to generate a correction voltage having a characteristic that varies by a slope approximating a slope of variation in the detection voltage that decreases along with an increase in the first power supply voltage, add the correction voltage to the detection voltage or a reference power supply voltage with such a polarity as canceling the slope of variation caused in the detection voltage by the slope of variation in the correction voltage, and input the voltage thus corrected to the comparator circuit.

2. The secondary-battery monitoring device according to claim 1,
wherein each of the first and second detection circuits is provided with the voltage correction circuit, and supply of the detection voltage detected at the detection terminal to the first detection circuit monitoring the charge current is carried out via an inverter amplifier connected between the detection terminal and the first detection circuit.

3. The secondary-battery monitoring device according to claim 1,
wherein, when the correction voltage increases by a positive slope along with an increase in the first power supply voltage, the voltage correction circuit is configured to correct the input to the comparator circuit with the correction voltage by either way of:
(a) inputting a voltage generated by subtracting the correction voltage from the reference power supply voltage to the one input node and inputting the detection voltage to the other input node; or (b) inputting a voltage generated by adding the correction voltage to the detection voltage to the other input node and inputting the reference power supply voltage to the one input node.

4. The secondary-battery monitoring device according to claim 3,
wherein, in a state in which the reference power supply voltage is applied to the one input node and the detection voltage corrected by the correction voltage is applied to the other input node in (b), the magnitude of the voltage applied to the other input node is determined based on the voltage of the one input node serving as a reference, and the detection signal is output based on the result of the determination.

5. The secondary-battery monitoring device according to claim 1, further comprising:
a power-supply-voltage generating circuit configured to generate a second power supply voltage having such a value as increasing in proportion to an increase in the first power supply voltage in a first range in which the first power supply voltage has a value equal to or smaller than a first value and generate the second power supply voltage having a fixed value in a second range in which the first power supply voltage has a value larger than the first value,
wherein the first and second driver circuits are operated by the second power supply voltage, and
wherein the voltage correction circuit generates the correction voltage increased by a positive slope along with an increase in the first power supply voltage in the first range and generates the correction voltage having a fixed value in the second range.

6. The secondary-battery monitoring device according to claim 5,
wherein the voltage correction circuit is provided with:
a third resistor voltage dividing circuit configured to subject the second power supply voltage to a resistor voltage division at a third resistance ratio; and
a fourth resistor voltage dividing circuit configured to subject the voltage that has undergone the voltage division in the third resistor voltage dividing circuit to a voltage division at a fourth resistance ratio based on the detection voltage serving as a reference, and
wherein the voltage that has undergone the voltage division in the fourth resistor voltage dividing circuit is generated as a corrected detection voltage.

7. The secondary-battery monitoring device according to claim 1,
wherein, when the correction voltage has such a characteristic as increasing by a negative slope along with an increase in the first power supply voltage, the detection circuit is configured to input a voltage generated by adding the correction voltage to the reference power supply voltage to the one input node as a corrected reference voltage, and determine the magnitude of the detection voltage based on the corrected reference voltage serving as a reference in a state in which the detection voltage is applied to the other input node.

8. The secondary-battery monitoring device according to claim 1, further comprising:
a power-supply-voltage generating circuit configured to generate a second power supply voltage having such a value as increasing in proportion to an increase in the first power supply voltage in a first range in which the first power supply voltage has a value equal to or smaller than a first value and generate the second power supply voltage having a fixed value in a second range in which the first power supply voltage has a value larger than the first value,
wherein the first and second driver circuits are operated by the second power supply voltage, and
wherein the voltage correction circuit is configured generate the correction voltage decreasing by a negative slope along with an increase in the first power supply voltage in the first range and generate the correction voltage having a fixed value in the second range.

9. The secondary-battery monitoring device according to claim 8,
wherein the voltage correction circuit is provided with:
a second resistor voltage dividing circuit configured to subject the second power supply voltage to a resistor voltage division at a second resistance ratio;
an amplifier circuit having a positive input node to which the reference power supply voltage is applied;
a third resistor coupled between a voltage dividing node of the second resistor voltage dividing circuit and a negative input node of the amplifier circuit; and
a fourth resistor coupled between the negative input node of the amplifier circuit and an output node of the amplifier circuit, and
wherein a voltage obtained at the output node of the amplifier circuit serves as the corrected reference voltage.

10. A battery pack comprising:
a secondary battery;
first and second battery connection nodes to which the secondary battery is coupled;
first and second external terminals to which a load or a charger is to be coupled;
a first current path arranged between the first battery connection node and the first external terminal;
a second current path arranged between the second battery connection node and the second external terminal;
a switch circuit inserted in the second current path so as to control a charge current and a discharge current flowing in the secondary battery and made up of a first FET configured to control a flow of the discharge current and a second FET configured to control a flow of the charge current; and
a switch control circuit configured to control on/off of the switch circuit,
wherein the switch control circuit is provided with:
a first power-supply node connected to the second current path at a line coupling the second battery connection node and one node on the second current path of the switch circuit;
a second power-supply node coupled to the first current path and supplied with a first power supply voltage from the secondary battery via the first battery connection node with a voltage on the first power-supply node serving as a reference;
first and second control nodes;
a first driver circuit configured to supply a control voltage to a gate of the first FET via the first control node;
a second driver circuit configured to supply a control voltage to a gate of the second FET via the second control node;
a detection node connected to the second current path at a line coupling the second external terminal and the other node on the second current path of the switch circuit;
a first detection circuit configured to monitor the charge current flowing to the secondary battery based on a detection voltage generated at the detection node, and output a detection signal when the detection voltage reaches a predetermined value;

a second detection circuit configured to monitor the discharge current, and output a detection signal when the current exceeds a predetermined current; and a control circuit configured to shut off the charge current or the discharge current flowing in the secondary battery by supplying a control voltage via the corresponding driver circuit to shut off the corresponding FET when the detection signal is output, and wherein at least either one of the first and second detection circuits is provided with:

a comparator circuit configured to determine, based on a voltage of one input node of the comparator circuit serving as a reference, magnitude of a voltage of the other input node of the comparator circuit, and output the detection signal based on a result of the determination; and a voltage correction circuit configured to generate a correction voltage having such a characteristic that varies by a slope approximating a slope of the detection voltage which decreases along with an increase in the first power supply voltage, add the correction voltage to the detection voltage or a reference power supply voltage with such a polarity as canceling the slope of the voltage variation caused in the detection voltage by the slope of variation in the correction voltage, and input the thus corrected voltage to the comparator circuit.

* * * * *